(12) United States Patent
Koshimizu

(10) Patent No.: US 11,337,304 B2
(45) Date of Patent: May 17, 2022

(54) STRETCHABLE WIRING BOARD AND METHOD FOR MANUFACTURING STRETCHABLE WIRING BOARD

(71) Applicant: Fujikura Ltd., Tokyo (JP)

(72) Inventor: Kazutoshi Koshimizu, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 16/979,248

(22) PCT Filed: Mar. 19, 2019

(86) PCT No.: PCT/JP2019/011425
§ 371 (c)(1),
(2) Date: Sep. 9, 2020

(87) PCT Pub. No.: WO2019/181931
PCT Pub. Date: Sep. 26, 2019

(65) Prior Publication Data
US 2021/0059046 A1 Feb. 25, 2021

(30) Foreign Application Priority Data

Mar. 19, 2018 (JP) .............................. JP2018-050527
Mar. 19, 2018 (JP) .............................. JP2018-050529

(51) Int. Cl.
*H05K 1/02* (2006.01)
*H05K 1/03* (2006.01)
*H05K 3/28* (2006.01)

(52) U.S. Cl.
CPC ......... *H05K 1/0283* (2013.01); *H05K 1/0393* (2013.01); *H05K 3/28* (2013.01); *H05K 2201/2009* (2013.01)

(58) Field of Classification Search
CPC ........................ H05K 1/0283; H05K 1/0277
See application file for complete search history.

(56) References Cited

U.S. PATENT DOCUMENTS 10,869,391 B2 * 12/2020 Kwon .................... H05K 1/092

FOREIGN PATENT DOCUMENTS

| CN | 107211529 A | 9/2017 |
|---|---|---|
| JP | 2014-023613 A | 2/2014 |
| JP | 2014-162124 A | 9/2014 |
| JP | 2016-143557 A | 8/2016 |
| JP | 2017-034038 A | 2/2017 |
| JP | 2017-069530 A | 4/2017 |
| JP | 2017-168437 A | 9/2017 |

(Continued)

OTHER PUBLICATIONS

International Search Report issued in corresponding International Application No. PCT/JP2019/011425 dated Jun. 11, 2019 (3 pages).

*Primary Examiner* — Jeremy C Norris
(74) *Attorney, Agent, or Firm* — Osha Bergman Watanabe & Burton LLP

(57) ABSTRACT

A stretchable wiring board includes: a first stretchable substrate; an overcoat layer; and a conductor layer interposed at least partly between the first stretchable substrate and the overcoat layer. The conductor layer includes a wiring portion covered with the overcoat layer and a connection portion that has a surface exposed from the overcoat layer. The exposed surface of the connection portion is flush with a top surface of the overcoat layer.

15 Claims, 17 Drawing Sheets

(56) References Cited

FOREIGN PATENT DOCUMENTS

| WO | 2017/047519 A1 | 3/2017 |
| WO | 2017/138388 A1 | 8/2017 |
| WO | 2017/159456 A1 | 9/2017 |

* cited by examiner

STRETCHABLE WIRING BOARD AND METHOD FOR MANUFACTURING STRETCHABLE WIRING BOARD

CROSS-REFERENCE TO RELATED APPLICATIONS

For designated countries that are permitted to be incorporated by reference in the literature, the contents of Patent Application No. 2018-50527, filed with Japan Patent Office on Mar. 19, 2018, and Patent Application No. 2018-50529, filed with Japan Patent Office on Mar. 19, 2018 are incorporated herein by reference and are regarded as a part of the description of this specification.

TECHNICAL FIELD

The present invention relates to a stretchable wiring board and a method for manufacturing the stretchable wiring board.

BACKGROUND ART

The wearable device and the medical device are provided in clothes and outfits, and sensing and monitoring are performed by a user wearing these clothes and braces. For this reason, a stretchable wiring board capable of expanding and contracting in accordance with the movement of the human body is used for these devices. As such a stretchable wiring board, there is known a stretchable wiring board comprising a sheet-like stretchable substrate having stretchability, a stretchable wiring portion formed on at least one side of a main surface of a stretchable substrate, and an external terminal connected to the wiring portion (for example, see Patent Document 1).

CITATION LIST

[Patent Literature 1] JP2017-34038A

However, the unevenness of the main surface of the stretchable wiring board is increased due to the differences caused by the wiring portion and the external terminal protruding from the main surface of the stretchable substrate. Therefore, there are issues that the wearable device gave the user a sense of discomfort and the unevenness was caught.

SUMMARY

One or more embodiments of the present invention provide a stretchable wiring board having a smooth main surface.

[1] A stretchable wiring board according to one or more embodiments of the present invention is a stretchable wiring board comprising a first stretchable substrate an overcoat layer and a conductor portion (i.e., conductor layer) interposed at least partly between the first stretchable substrate and the overcoat layer, the conductor portion comprises a wiring portion covered with the overcoat layer; and a connection portion exposed from the overcoat layer, an exposed surface of the connection portion exposed from the overcoat layer is flush with a surface of the overcoat layer.

[2] In one or more embodiments, the stretchable wiring board may further comprise a first reinforcing member interposed between the first stretchable substrate and the conductor portion, the first reinforcing member may be disposed so as to overlap with at least a part of the connection portion when viewed from a thickness direction of the conductor portion.

[3] In one or more embodiments, the first reinforcing member may be buried in first stretchable substrate.

[4] In one or more embodiments, the stretchable wiring board may further comprise a second reinforcing member overlapping with at least a part of wiring portion when viewed from a thickness direction of the conductor portion.

[5] In one or more embodiments, the second reinforcing member may be harder than the first stretchable substrate.

[6] In one or more embodiments, the stretchable wiring board may comprise the second reinforcing members, the second reinforcing members may be intermittently disposed along the wiring portion.

[7] In one or more embodiments, the following formula (1) may be satisfied.

$$50 \text{ mm} \leq L \leq 200 \text{ mm} \tag{1}$$

Here, L is a distance between the first reinforcing members adjacent to each other.

[8] In one or more embodiments, the wiring portion may comprise a branch portion branching into a plurality, the second reinforcing member may overlap with the branch portion when viewed from a thickness direction of the conductor portion.

[9] In one or more embodiments, the second reinforcing member may be buried in the first stretchable substrate.

[10] In one or more embodiments, the stretchable wiring board may comprise a primer layer interposed between the first stretchable substrate and the conductor portion.

[11] In one or more embodiments, the first stretchable substrate may be a hot melt or an elastomer.

[12] In one or more embodiments, the stretchable wiring board may comprise a fabric affixed to the hot-melt.

[13] In one or more embodiments, the stretchable wiring board may comprise a second stretchable substrate covering the overcoat layer, and the second reinforcing member may be harder than the second stretchable substrate.

[14] A method for manufacturing a stretchable wiring board is a method for manufacturing the above-mentioned stretchable wiring board comprise a first step of preparing a release film, a second step of forming the overcoat layer on the release film, a third step of forming the connection portion of the conductor portion on the release film, a fourth step of forming the wiring portion of the conductor portion on the overcoat layer, and a fifth step of forming the first stretchable substrate.

[15] In the method for manufacturing the stretchable wiring board, the first stretchable substrate may be hot-melt, the method may comprise a sixth step of affixing a fabric to the hot-melt, and a seventh step of peeling off the release film.

[16] The stretchable wiring board according to one or more embodiments of the present invention comprises a first stretchable substrate, a conductor portion including a wiring portion and a connection portion connected to the wiring portion and provided on the first stretchable substrate, and a first reinforcing member disposed so as to overlap a part of the wiring portion in a plan view and harder than the first stretchable substrate.

[17] In one or more embodiments, the stretchable wiring board may comprise a second reinforcing member disposed so as to overlap the connection portion in plan view.

[18] In one or more embodiments, the stretchable wiring board may comprise the first reinforcing members, and the first reinforcing members may be intermittently disposed along the wiring portion.

[19] In one or more embodiments, the following formula (1) may be satisfied.

$$50 \text{ mm} \leq L \leq 200 \text{ mm} \tag{1}$$

Here, L is a distance between the first reinforcing members adjacent to each other.

[20] In one or more embodiments, the wiring portion may comprise a branch portion branching into a plurality, and the first reinforcing member may be disposed so as to overlap the branch portion in plan view.

[21] In one or more embodiments, the first stretchable substrate may be a hot-melt or an elastomer.

[22] In one or more embodiments, the first reinforcing member may be buried in the hot-melt or the elastomer.

[23] In one or more embodiments, the stretchable wiring board may comprise a primer layer interposed between the first stretchable substrate and the conductor portion.

[24] In one or more embodiments, the stretchable wiring board may comprise a primer layer interposed between the first stretchable substrate and the conductor portion.

[25] In one or more embodiments, the stretchable wiring board may comprise an overcoat layer covering the wiring portion.

[26] In one or more embodiments, the stretchable wiring board may comprise a second stretchable substrate covering the overcoat layer, and the first reinforcing member may be harder than the second stretchable substrate.

According to one or more embodiments of the present invention, since the exposed surface of the connection portion and the surface of the overcoat layer are flush with each other, it is possible to reduce unevenness of the main surface of the stretchable wiring board.

DETAILED DESCRIPTION

Hereinafter, embodiments of the present invention will be described with reference to the drawings.

First Embodiment

Figure 1:
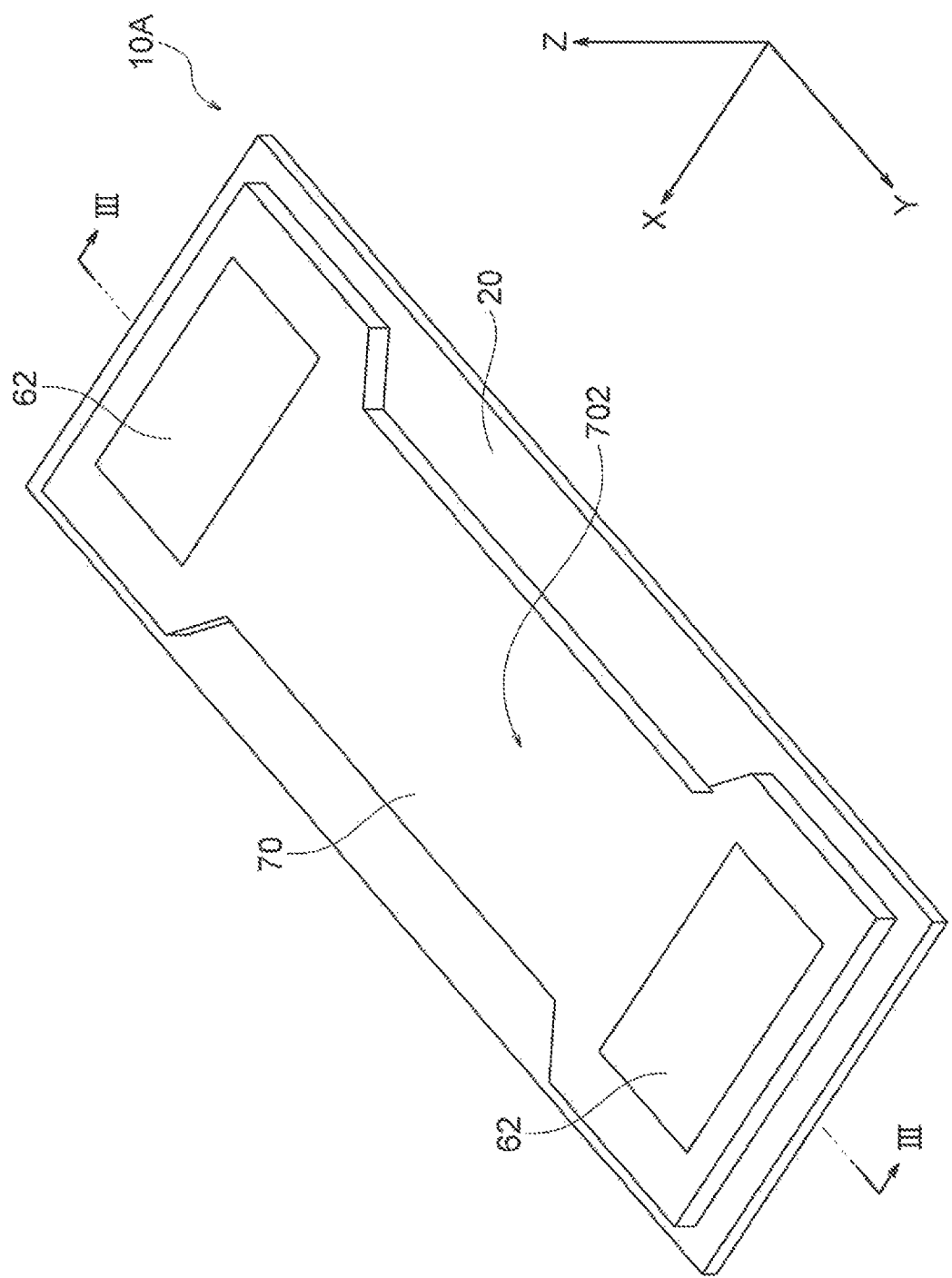
FIG. 1 is a perspective view showing an stretchable wiring board according to the first embodiment of the present invention.
Figure 2:
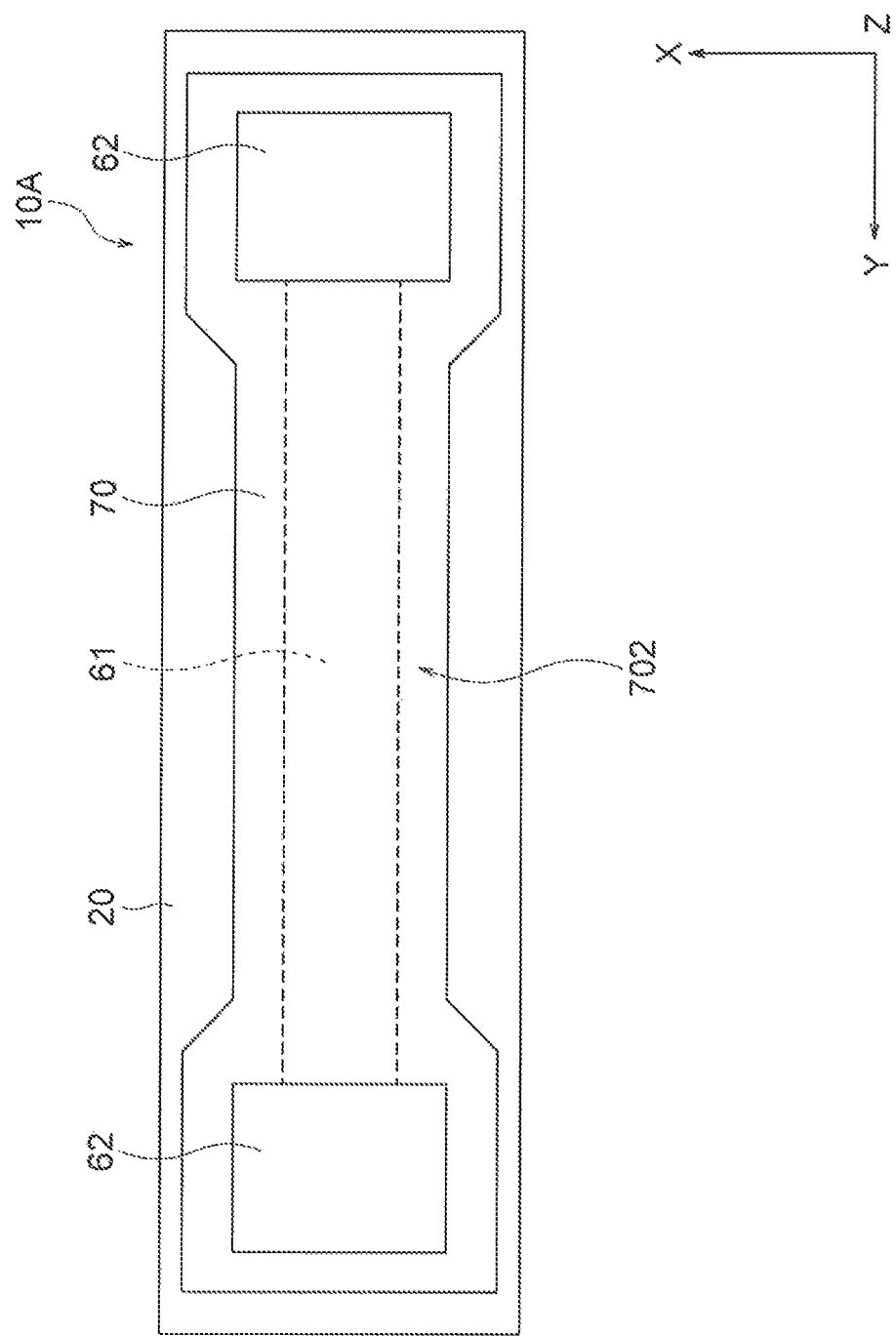
FIG. 2 is a plan view showing an stretchable wiring board according to the first embodiment of the present invention.
Figure 3:
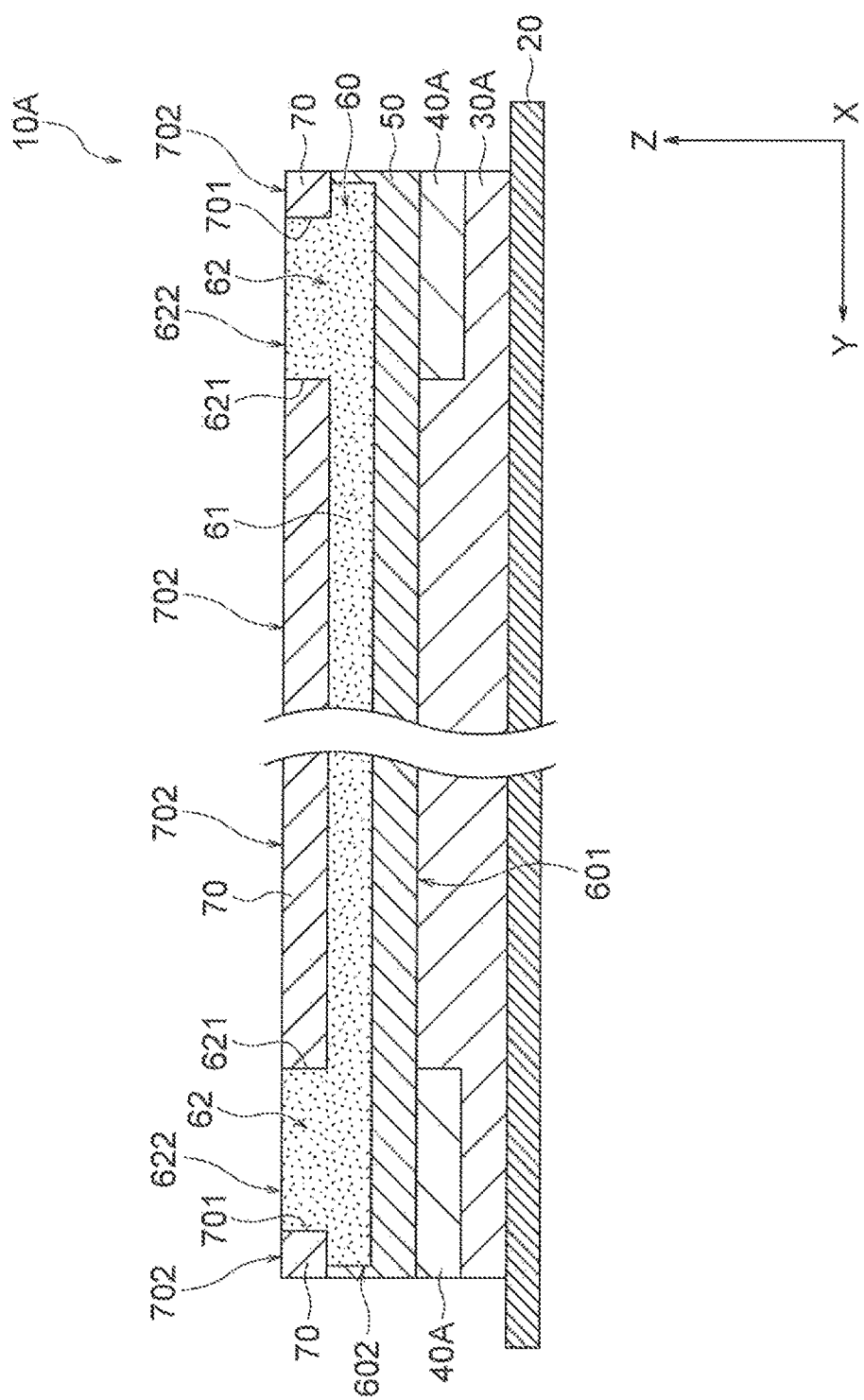
FIG. 3 is a cross-sectional view taken along line of FIG. 1.
Figure 4:
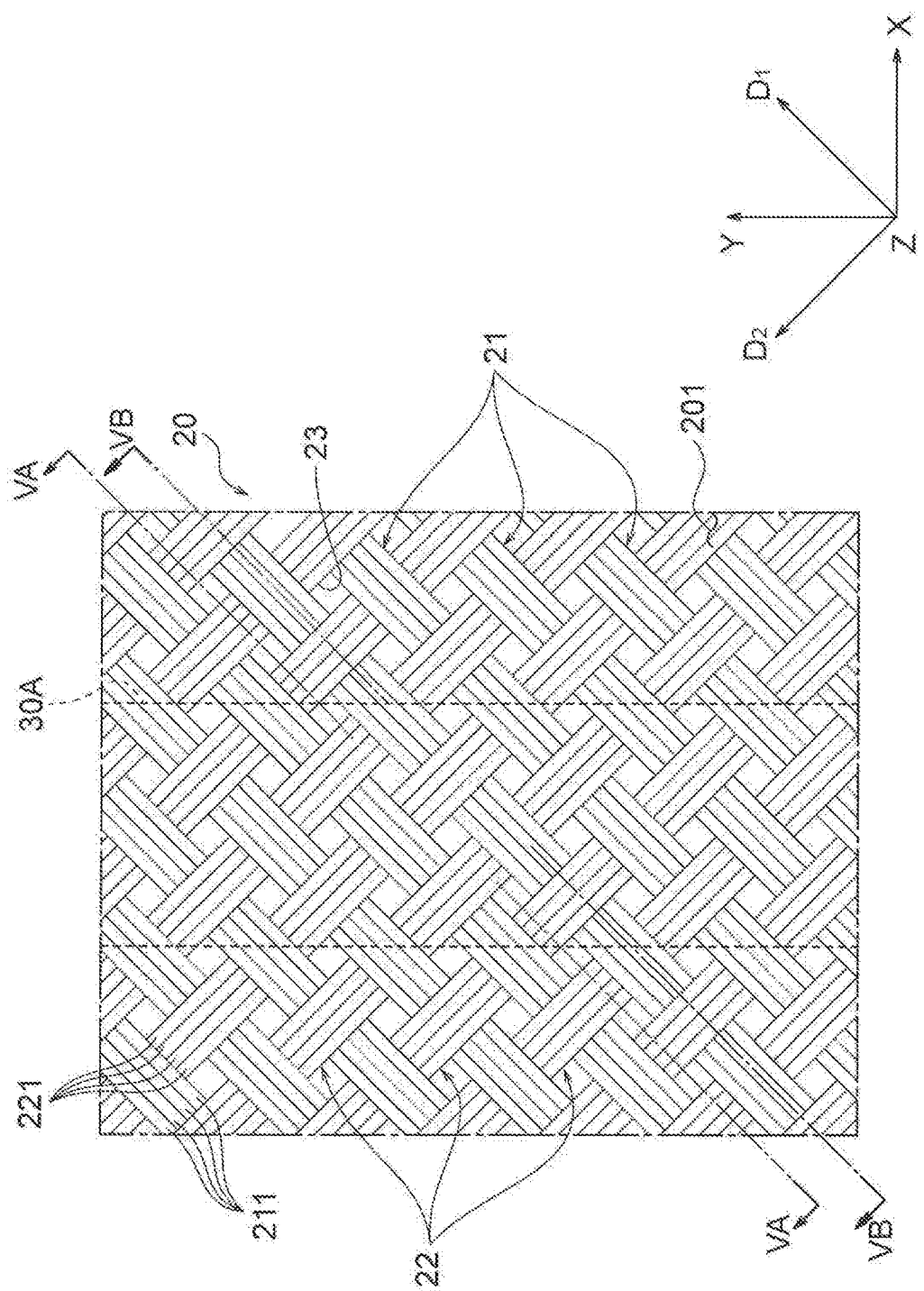
FIG. 4 is a plan view showing an stretchable substrate according to the first embodiment.
Figure 5A:
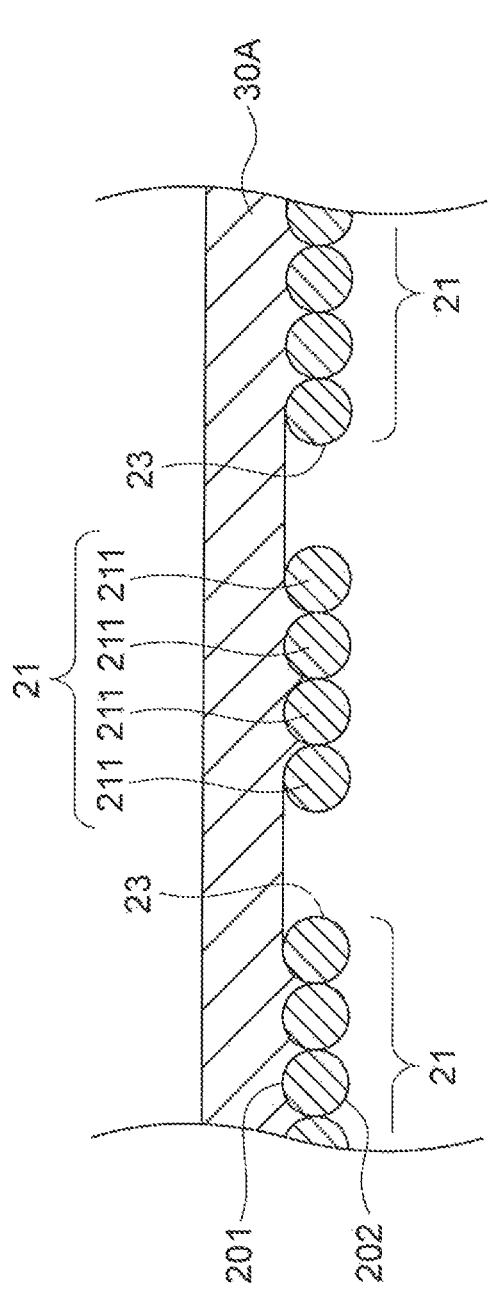
FIG. 5A is a cross-sectional view taken along VA-VA line of FIG. 4.
Figure 5B:
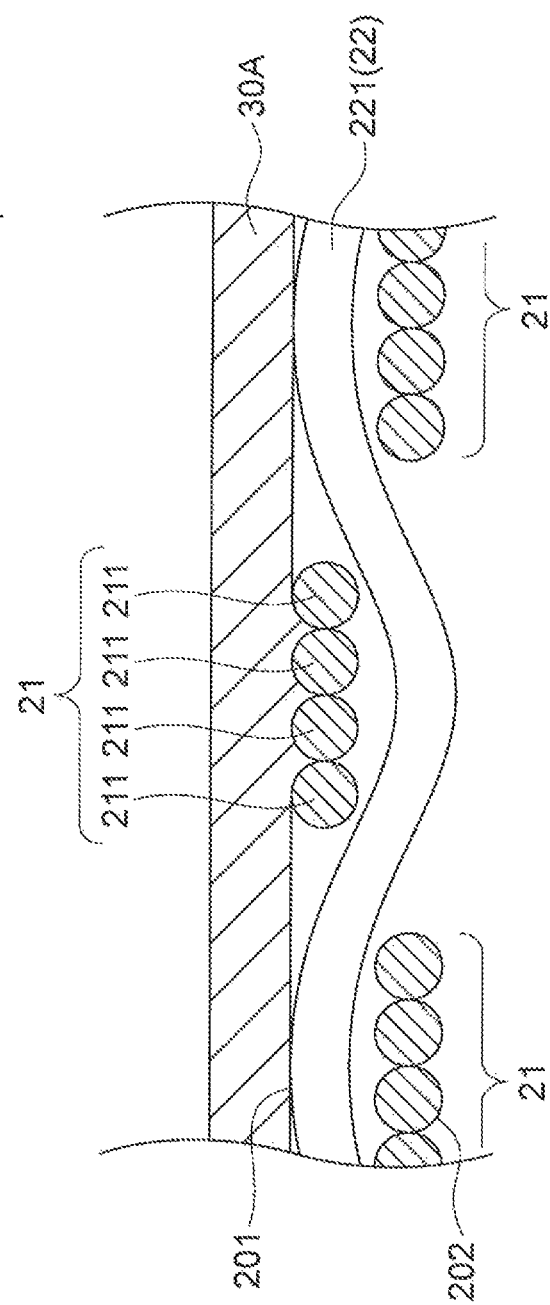
FIG. 5B is a cross-sectional view taken along VB-VB line of FIG. 4.

FIG. 1 is a perspective view showing an stretchable wiring board according to the first embodiment of the present invention, FIG. 2 is a plan view showing an stretchable wiring board according to the first embodiment of the present invention, FIG. 3 is a cross-sectional view taken along line of FIG. 1, FIG. 4 is a plan view showing an stretchable substrate according to the first embodiment, FIG. 5A is a cross-sectional view taken along VA-VA line of FIG. 4, and FIG. 5B is a cross-sectional view taken along VB-VB line of FIG. 4.

The stretchable wiring board 10A shown in FIGS. 1 and 2 is used, for example, in a portion where stretchability is required in a wearable device such as a biological sensor and a medical device such as a biological information monitor. Since the wearable device and the medical device are provided on clothes and braces, it is necessary for the stretchable wiring board 10A to sufficiently follow the bending of the human body. The use of the stretchable wiring board 10A is not particularly limited as long as the stretchability is required. The stretchable wiring board 10A is provided with, for example, electronic components. As the electronic component, a pressure sensitive sensor or silver/silver chloride electrode are formed, or a mounted component such as an integrated circuits (IC), a condenser, or a light emitting diode (LED) are mounted.

As shown in the cross-sectional view of FIG. 3, the stretchable wiring board 10A of the present embodiment includes a fabric 20, a hot-melt layer 30A, a first reinforcing member 40A, a primer layer 50, a conductor portion 60, and an overcoat layer 70. The "stretchable wiring board 10A" in the present embodiment corresponds to an example of the "stretchable wiring board," the "fabric 20" in the present embodiment corresponds to an example of the "fabric," the "hot-melt layer 30A" in the present embodiment corresponds to an example of the "first stretchable substrate," the "first reinforcing member 40A" in the present embodiment corresponds to an example of the "first reinforcing member," the "primer layer 50" in the present embodiment corresponds to an example of the "primer layer," the "conductor portion 60" in the present embodiment corresponds to an example of the "conductor portion," and the "overcoat layer 70" in the present embodiment corresponds to an example of the "overcoat layer."

The fabric 20 is an object to which the hot-melt layer 30A is to be stuck, and is a fabric portion of a garment or a brace provided with a wearable device or the like. This fabric 20 is composed of a woven fabric composed of a plurality of fibers, and more specifically as shown in FIG. 4, is constituted by a first fiber bundle 21 and a second fiber bundle 22 which intersect each other. In FIG. 4, only the stretchable substrate portion consisting of the fabric 20 and the hot-melt layer 30A is excerpted and shown. The first fiber bundle 21 is composed of one or more first fibers 211 assembled together. The first fiber bundle 21 extends in a direction $D_1$ (hereinafter, also referred to as a first direction $D_1$) that is inclined with respect to the Y direction in the figure (the stretching and contracting direction of the stretchable circuit board 10A), and the plurality of first fiber bundles 21 are parallel to a direction $D_2$ (hereinafter, also referred to as a second direction $D_2$) that intersects with the first direction $D_1$. The second fiber bundle 22 is composed of one or more second fibers 221. The second fiber bundle 22 extends in a second directional $D_2$, and the plurality of second fiber bundles 22 are parallel to the first directional $D_1$. The fabric 20 is constituted by weaving first fiber bundles 21 and second fiber bundles 22 with each other in a plan view.

As the first fiber 211 and the 2 fiber 221, for example, rayon, nylon, polyester, acrylic, polyurethane, vinylon, polyethylene, Nafion (registered trademark), aramid, cotton, or the like can be used. The first fiber 211 and the second fiber 221 may have stretchability. The first fiber 211 and the second fiber 221 may be the same or different from each other. Further, the amount of the first fiber 211 and the amount of the second fiber 221 may be the same or different from each other.

In plan view, a rectangular gap 23 is formed between the first fiber bundle 21 and the second fiber bundle 22 crossing each other. In plan view, the gap 23 is defined by first fiber bundles 21 and 21 adjacent to each other and second fiber bundles 22 and 22 adjacent to each other.

The gap 23 opens to one major surface 201 of the fabric 20 and the other major surface 202 (see FIGS. 5A and 5B) of the fabric 20, and communicates one major surface 201 with the other major surface 202 of the fabric 20. The gap 23 may not extend straight along thickness of the fabric 20, but may open at both major surfaces 201, 202 and communicate with both major surfaces 201, 202. Since the gap 23 is deformed in accordance with the deformation of the stretchable wiring board 10A, the fabric 20 as a whole exhibits stretchability.

Further, the Young's modulus $E_f$ of the fabric 20 may be 0.1 to 35 MPa (0.1 MPa≤$E_f$≤35M Pa). Further, the rupture elongation $B_f$ of the fabric 20 may be 50% or more ($B_f$≥50%). It should be noted that "rupture elongation" means the elongation of the material up to the point of break relative to its natural length. Further, thickness $T_f$ of the fabric 20 may be 20 to 300 μm (20 μm≤$T_f$≤300 μm).

In FIGS. 1 to 4, the entire shape of the fabric 20 is rectangular, but is not particularly limited thereto. The entire shape of the fabric 20 will vary depending on the shape of the cloth or the brace in which the wearable device is provided.

The hot-melt layer 30A is affixed to the main surface 201 of the fabric 20, as shown in FIG. 3, and is formed on the fabric 20. As shown in FIGS. 5A and 5B, the hot-melt layer 30A is in close contact with the first fibers 211 and the second fibers 221 located on the main surface 201 of the fabric 20, and enters between the first fibers 211 constituting one first fiber bundle 21 and between the second fibers 221 constituting one second fiber bundle 22. This hot-melt layer 30A is slightly impregnated in the vicinity of the surface of the first fiber 211 and the second fiber 221 in contact, but is not impregnated into the interior of the first fiber 211 and the second fiber 221. In other words, in this embodiment, the hot-melt layer 30A is not completely impregnated to the inside of the first fiber 211 and the second fiber 221.

This hot-melt layer 30A is formed in a bridge shape between adjacent first fiber bundles 21 through a gap 23. Similarly, the hot-melt layer 30A is formed in a bridge shape between adjacent second fiber bundles 22 through the gap 23. As a result, the hot-melt layer 30A covers the gap 23 that opens to the main surface 201 of the fabric 20. Further, the hot-melt layer 30A does not enter the interior of the gap 23, and the interior of the gap 23 is not filled with the hot-melt layer 30A. Note that the hot-melt layer 30A may slightly enter the interior of the gap 23 in the vicinity of the opening of the gap 23 as long as the hot-melt layer 30A does not fill the interior of the gap 23.

The hot-melt layer 30A has stretchability, and as a constituent material thereof, a hot melt-based resin material such as polyester, polyurethane, acrylic, styrene butadiene rubber, or silicon can be used.

Returning to FIG. 3, the first reinforcing member 40A is located between the hot-melt layer 30A and the primer layer 50, in the present embodiment is buried in the hot-melt layer 30A. Further, the conductor portion 60 is positioned above the first reinforcing member 40A via the primer layer 50. In other words, the first reinforcing member 40A is interposed between the hot-melt layer 30A and the conductor portion 60. The connection portion 62 of the present embodiment corresponds to an example of the "connection portion."

The first reinforcing member 40A is disposed so as to overlap the connection portion 62 when viewed from the thickness direction of the conductor portion 60 (is Z direction in the drawings, is also the thickness direction of the stretchable wire board 10A). The first reinforcing member 40A disposed in this manner particularly reinforces the connection portion 62. Since an external device is connected in the connection portion 62, the connection portion 62 is easily stressed. It is possible to prevent damage to the connection portion 62 by reinforcement by the first reinforcing member 40A. In addition, since the first reinforcing member 40A is buried in the hot-melt layer 30A, even if the first reinforcing member 40A is disposed, a difference in level does not occur on the stretchable wiring board 10A. Therefore, the smoothness of both main surfaces of the stretchable wiring board 10A can be improved. In addition, the first reinforcing member 40A is interposed between the hot-melt layer 30A and the conductor portion 60, and the first reinforcing member 40A is disposed at a position close to the conductor portion 60. Therefore, the connection portion 62 can be reliably reinforced.

The first reinforcing member 40A is not particularly limited, but for example, an adhesive tape or the like can be used as the first reinforcing member. The adhesive tape is not particularly limited, but for example, an adhesive tape composed of a polyester film with an acrylic adhesive layer on its main surface can be used. In this case, the first reinforcing member 40A is disposed by sticking the acrylic adhesive layer to the primer layer 50.

The primer layer 50 is provided on the hot-melt layer 30A and the first reinforcing member 40A, and is interposed between the hot-melt layer 30A and the conductor portion 60. The primer layer 50 covers the lower surface 601 and the side surface 602 of the conductor portion 60, and the planar shape of the primer layer 50 is substantially the same as the planar shape of the conductor portion 60. Further, the primer layer 50 has stretchability similarly to the fabric 20 and the like.

The primer layer 50 functions as a buffer layer for preventing breakage of the conductor portion 60 and as a waterproof layer when the stretchable wiring board 10A is extended. As a material constituting such a primer layer 50, a polyester resin, a polyurethane resin, an acrylic resin, or a silicon resin can be exemplified.

The Young's modulus $E_p$ of the primer layer 50 may be less than or equal to the Young's modulus $E_f$ of the fabric 20 ($E_p \leq E_f$), or may be lower than the Young's modulus $E_f$ of the fabric 20 ($E_p < E_f$) from the viewpoint of enhancing the function as the buffer layer between the fabric 20 and the conductor portion 60. The Young's modulus $E_p$ of the primer layer 50 may be 0.1 to 10 MPa (0.1 MPa$\leq E_p \leq$10M Pa). The rupture elongation $B_p$ of the primer layer 50 may be 50% or more ($B_p \geq 50\%$). The thickness $T_p$ of the primer layer 50 may be 10 to 50 μm (10 μm$\leq T_p \leq$50 μm).

The conductor portion 60 is provided on the primer layer 50. The conductor portion 60 includes a wiring portion 61 covered with the overcoat layer 70 and a connection portion 62 exposed to the outside from the overcoat layer 70. That is, the wiring portion 61, which is a part of the conductor portion 60, is interposed between the hot-melt layer 30A and the overcoat layer 70. The "wiring portion 61" in the present embodiment corresponds to an example of the "wiring portion," and the "connection portion 62" in the present embodiment corresponds to an example of the "connection portion."

Wiring portion 61 is integrally formed with the connection portion 62, and electrically connects the plurality of connection portions 62 to each other. In the present embodiment, as shown in FIGS. 1 and 2, the wiring portion 61 has a single strip-shaped planar shape, but is not limited thereto. For example, the wiring portion 61 may have an arbitrary pattern such as a branched planar shape depending on the application of the stretchable wiring board 10A.

The connection portion 62 has a convex protruding portion 621 protruding in a direction away from the hot-melt layer 30A. An exposed surface 622 of the protruding portion 621 is exposed from the overcoat layer 70. The "exposed surface 622" of the present embodiment corresponds to an example of the "exposed surface."

Although not particularly limited, the connection portion 62 can be used as a connection terminal with an electronic device, and conduction with the electronic device is ensured on the exposed surface 622. Although the present embodiment exemplifies a mode in which two connection portions 62 are provided, the present invention is not limited to this, and three or more connection portions 62 may be provided depending on the use of the stretchable wiring board 10A.

The conductor portion 60 is formed by dispersing conductive particles in a binder, and has stretchability. Here, the stretchability is imparted to the conductor portion 60 by the binder contained in the conductor portion 60 is made of a material having stretchability. An elastomer may be used as the binder, and for example, acrylic rubber, urethane rubber, nitrile rubber, silicone rubber, fluorine rubber, these two or more composites or the like can be used as the elastomer. As the conductive particles, a metal material such as gold, silver, platinum, ruthenium, lead, tin, zinc, bismuth, or an alloy thereof, or a nonmetallic material such as carbon can be used. The shape of the conductive particles may be a scaly shape or an indefinite shape.

Depending on the use of the stretchable wiring board 10A, the conductive particles included in the protrusion 621 may be different types of conductive particles included in the wiring portion 61. For example, although not particularly limited, carbon may be used as the conductive particles included in the projecting portion 621, and silver may be used as the conductive particles included in the wiring portion 61.

The Young's modulus $E_c$ of the conductor portion 60 may be higher than the Young's modulus $E_f$ of the fabric 20 ($E_c > E_f$), may be lower than the Young's modulus $E_f$ of the fabric 20 ($E_c < E_f$), may be the same as the Young's modulus $E_f$ of the fabric 20 ($E_c = E_f$). In particular, the Young's modulus $E_c$ of the conductor portion 60 may be higher than the Young's modulus $E_f$ of the fabric 20 ($E_c > E_f$). The Young's modulus $E_c$ of the conductor portion 60 may be 10 to 200 MPa (10 MPa$\leq E_c \leq$200M Pa). Further, the maximum extensibility $LE_c$ of the conductor portion 60 may be 5 to 50% (5%$\leq LE_c \leq$50%). Further, as the rupture elongation $B_c$ of the conductor portion 60 may be 10 to 100% (10%$\leq B_c \leq$100%).

The overcoat layer 70 is provided on the conductor portion 60 and the primer layer 50, and protects the conductor portion 60 by covering at least a part of the conductor portion 60. Specifically, the upper surface and the side surface of the protrusion 621 of the wiring portion 61 is covered with the overcoat layer 70. A hole 701 penetrating from one main surface to the other main surface of the overcoat 70 is formed, and a protrusion 621 is formed inside the hole 701.

The surface 702 of the overcoat layer 70, which is a main surface of the overcoat layer 70 that is not in contact with the conductor portion 60, is flush with the exposed surface 622 of the connection portion 62. In the present embodiment, "flush" means that the surface 702 of the overcoat layer 70 and the exposed surface 622 of the connection portion 62 are located on the same plane, or that size D of a difference in level is 5 μm or less (0 μm$\leq D \leq$5 μm). In particular, the size D of a difference in level may be 1 μm or less (0 μm$\leq D \leq$1 μm).

As in the case of the fabric 20, the overcoat layer 70 may have stretchability. As a material constituting the overcoat layer 70, polyester, polyurethane, acrylic, silicon, or the like can be exemplified.

The Young's modulus $E_o$ of the overcoat layer 70 may be higher than the Young's modulus $E_p$ of the primer layer 50 ($E_o > E_p$), or may be lower than the Young's modulus $E_c$ of the transducer portion 60 ($E_o < E_c$). The Young's modulus $E_o$ of the overcoat layer 70 may be 5 to 100 MPa (5 MPa$\leq E_o \leq$100M Pa). Further, the maximum extensibility $LE_o$ of the overcoat layer 70 may be 10 to 50% (10%$\leq LE_o \leq$50%). Further, the breaking elongation $B_o$ of the overcoat layer 70 may be 50% or more ($B_o \geq 50\%$). Further, thickness $T_o$ of the overcoat layer 70 may be 10 to 20 μm (10 μm$\leq T_o \leq$20 μm).

Further, the material constituting the overcoat layer 70 and the material constituting the primer layer 50 may be substantially the same material. In this case, the interface between the primer layer 50 and the overcoat layer 70 is slightly visible, and the primer layer 50 and the overcoat layer 70 are substantially integrated.

In order to improve waterproofness, an stretchable substrate (not shown) may be affixed on the overcoat layer 70 so as to cover the interface between the overcoat layer 70 and the connection portion 62. As the material constituting this stretchable substrate, a resin material can be used, and this resin material may have a waterproof property. The resin material having this waterproof property is not particularly limited, but a seam tape can be used. Further, a release film 80, which will be described later, may be attached to the overcoat layer 70 (see FIG. 7G).

The stretchable wiring board 10A of the present embodiment as described above has the following effects.

In the stretchable wiring board 10A according to the present embodiment, since the surface 702 of the overcoat layer 70 and the exposed surface 622 of the connection portion 62 are flush with each other, it is possible to reduce unevenness on the surface of the stretchable wiring board 10A to such an extent that the user does not feel uncomfortable in the wearable device or the like.

Further, the hot-melt layer 30A exhibits fluidity by being heated, for example at the time of sticking to the fabric 20. Due to the fluidity of the hot-melt layer 30A, it is possible to absorb the irregularities on the surface of the fabric 20, and also to absorb the difference in level between the primer layer 50 and the first reinforcing member 40A, so that it is possible to reduce the unevenness as a whole of the stretchable wiring board 10A.

Figure 6:
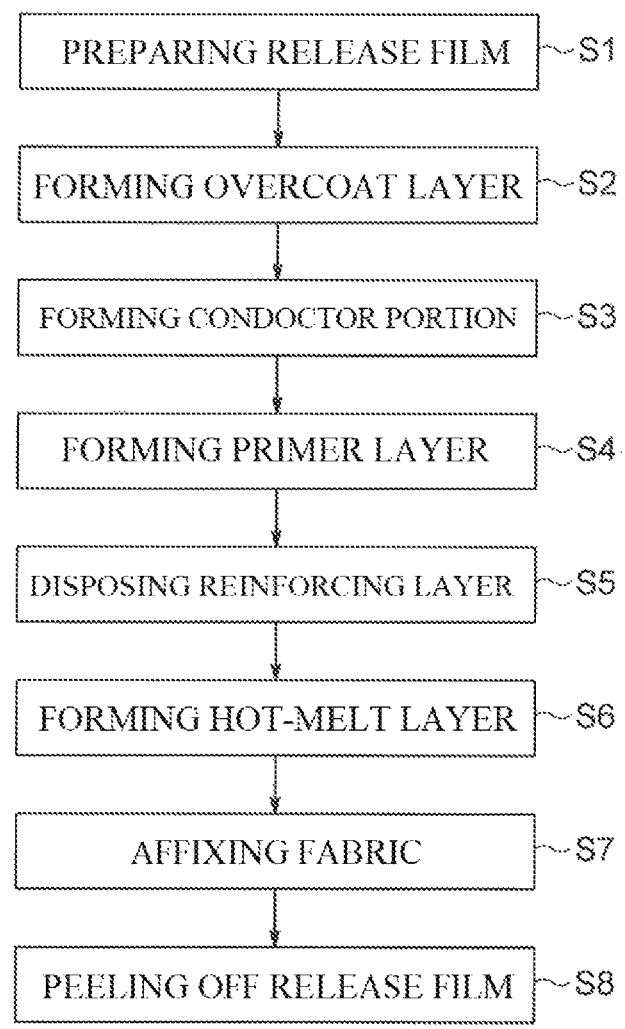
FIG. 6 is a flow sheet showing a method of manufacturing a stretchable wiring board according to the first embodiment of the present invention.
Figure 7A:
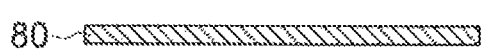
FIGS. 7A to 7H are cross-sectional views showing each of steps of FIG. 6.
Figure 7B:
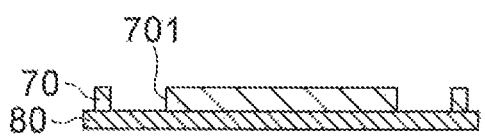
Figure 7C:
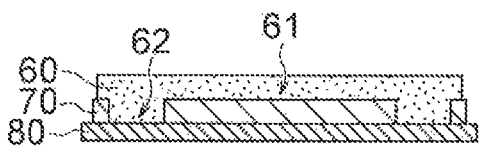
Figure 7D:
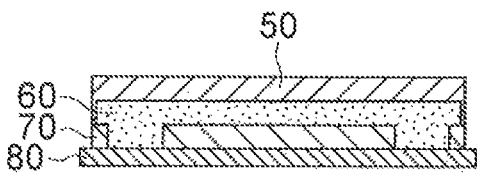
Figure 7E:
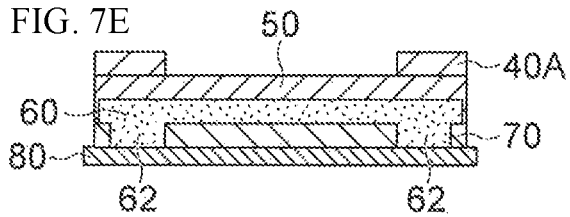
Figure 7F:
Figure 7G:
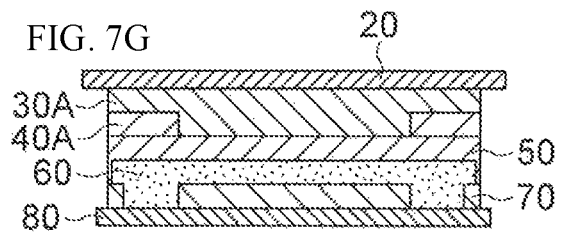
Figure 7H:
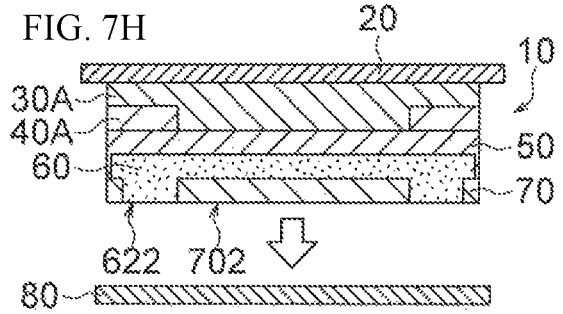
Figure 7H:
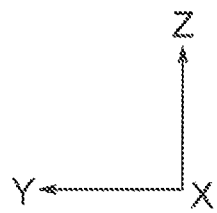

Next, a method of manufacturing the stretchable wiring board of the present embodiment will be described with reference to FIGS. 6 and 7A to 7H. FIG. 6 is a flow sheet for explaining the method of manufacturing the stretchable wiring board according to the present embodiment. FIGS. 7A to 7H are diagrams showing respective steps of FIG. 6, specifically, FIG. 7A is a cross-sectional view for explaining a step of preparing the release film, FIG. 7B is a cross-sectional view for explaining a step of forming the overcoat layer, FIG. 7C is a cross-sectional view for explaining a step of forming the conductor portion, FIG. 7D is a cross-sectional view for explaining a step of forming the primer layer, FIG. 7E is a cross-sectional view for explaining a step of disposing the first reinforcing member, FIG. 7F is a cross-sectional view for explaining a step of forming the hot-melt layer, FIG. 7G is a cross-sectional view for explaining a step of attaching the fabric, and FIG. 7H is a cross-sectional view for explaining a step of peeling the release film.

As shown in FIG. 6, the method of manufacturing the stretchable wiring board of the present embodiment includes the step of preparing the release film (a step S1), the step of forming the overcoat layer (a step S2), the step of forming a conductor portion (a step S3), the step of forming the primer layer (a step S4), the step of arranging the first reinforcing member (a step S5), the step of forming the hot-melt layer (a step S6), the step of attaching the fabric (a step S7), and the step of peeling the release film (a step S8).

First, in the step S1 of FIG. 6, as shown in FIG. 7A, the release film 80 is prepared. This release film 80 is a resin film subjected to a release process, and is not particularly limited, and for example, a release treatment PET film can be used as the release film 80. The step S1 in this embodiment corresponds to an example of the "first step."

Next, in the step S2 of FIG. 6, as shown in FIG. 7B, the overcoat layer 70 having a predetermined pattern is formed on one main surface of the release film 80. Here, the holes 701 in which the overcoat layer 70 is not formed on the release film 80 are also formed at the same time. The overcoat layer 70 is formed by coating the material constituting the overcoat layer 70 described above on the release film 80 and curing the material. As the coating method, various coating methods such as a screen printing method, a spray coating method, a bar coating method, a dip method, and an inkjet method can be employed. As a curing method, irradiation with energy rays such as ultraviolet rays and infrared laser rays, heating, heating and cooling, and drying, or the like can be employed. The step S2 in this embodiment corresponds to an example of the "second step."

Next, in the step S3 of FIG. 6, as shown in FIG. 7C, the conductor portion 60 is formed. At this time, the connection portion 62 is formed in the inside of the hole 701, the wiring portion 61 is formed on the overcoat layer 70. The conductor portion 60 is formed by applying a conductive paste to the inside of the hole 701 and on the overcoat layer 70, and curing the conductive paste. Specific examples of the conductive paste for forming the conductor portion 60 may be exemplified by conductive particles, a binder, water or a solvent, and a conductive paste constituting by mixing various additives. Examples of the solvent contained in the conductive paste include butyl cellosolve acetate, carbitol acetate, butyl carbitol acetate, dipropylene glycol monobutyl Ether, diethylene glycol monoethyl Ether, cyclohexanone, isophorone, and terpineol. As for the coating method and the curing method, the same method as in the case of forming the overcoat layer 70 can be used. The step S3 in the present embodiment corresponds to examples of the "third step of forming the connection portion on the release film" and the "fourth step of forming the wiring portion on the overcoat layer." Thus, in this embodiment, the "third step" and the "fourth step" are simultaneously performed.

Next, in the step S4 of FIG. 6, as shown in FIG. 7D, the primer layer 50 is formed on the conductor portion 60. The primer layer 50 is formed by applying the above-described resin material to the conductor portion 60 and curing the resin material. As for the coating method and the curing method, the same method as in the case of forming the overcoat layer 70 can be used.

Next, in the step S5 of FIG. 6, as shown in FIG. 7E, the first reinforcing member 40A is disposed on the primer layer 50. The first reinforcing member 40A, when viewed from the thickness direction of the conductor portion 60, disposed at a position overlapping the connection portion 62. Although not particularly limited, specifically, the first reinforcing member 40A is formed by preparing the above-described adhesive tape and sticking the adhesive layer of the adhesive tape to the primer layer 50.

Next, in the step S6 of FIG. 6, as shown in FIG. 7F, the hot-melt layer 30A is formed on the first reinforcing member 40A and the primer layer 50. The hot-melt layer 30A can be formed by placing the above-described thermoplastic hot-melt adhesive on the first reinforcing member 40A and the primer layer 50. At this time, the hot-melt adhesive may be heated and molded into an arbitrary shape. Further, a sheet-like hot-melt adhesive may be used as this adhesive. The step S6 in this embodiment corresponds to an example of the "fifth step."

Next, in the step S7 of FIG. 6, as shown in FIG. 7G, the fabric 20 is affixed to the hot-melt layer 30A. Although not particularly limited, specifically, the hot-melt layer 30A in a state in which is softened by heating is affixed to the fabric 20. The step S7 in this embodiment corresponds to an example of the "sixth step."

Next, in the step S8 of FIG. 6, as shown in FIG. 7H, the release film 80 is peeled from the stretchable wiring board 10A. The step S8 in this embodiment corresponds to an example of the "seventh step." Note that the timing at which the release film 80 is peeled off is not limited only after the fabric 20 is affixed. For example, the release film 80 may be peeled off after the formation of the hot-melt layer 30A (after the step S6 in FIG. 6) and before the affixing of the fabric 20 (before the step S7 in FIG. 6).

According to the manufacturing method of the stretchable wiring board 10A of the present embodiment, since the smooth surface shape of the release film 80 is transferred to the exposed surface 622 of the connection portion 62 and the surface 702 of the overcoat layer 70, the both surfaces are smooth and it is possible to prevent the occurrence of a difference in level at both boundaries (the both surfaces are flush with each other). As a result, the unevenness on the surface of the stretchable wiring board can be reduced to the extent that the user of the wearable device or the like does not feel uncomfortable.

Second Embodiment

Figure 8:
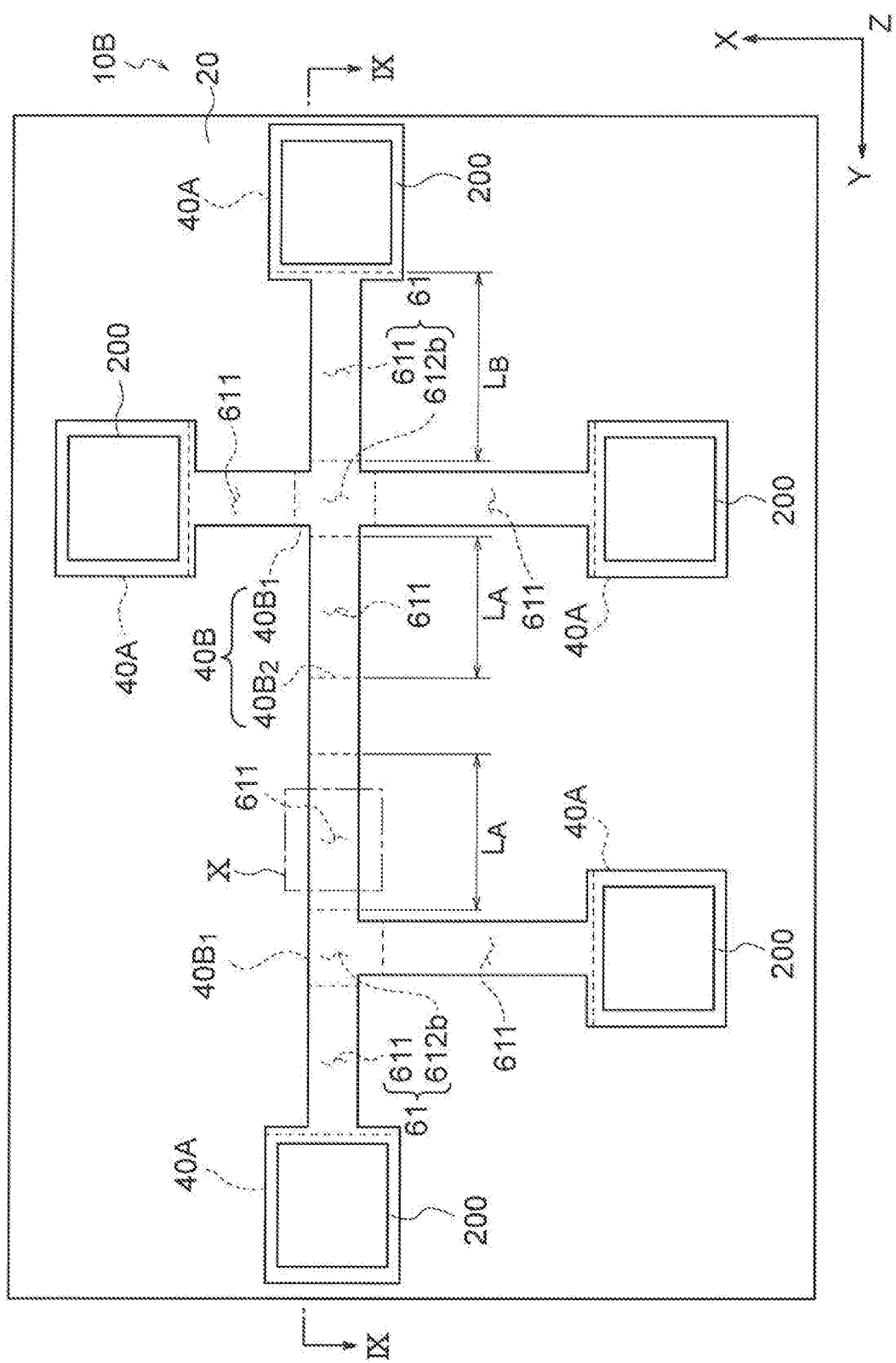
FIG. 8 is a plan view of an stretchable wiring board according to the second embodiment of the present invention.
Figure 9:
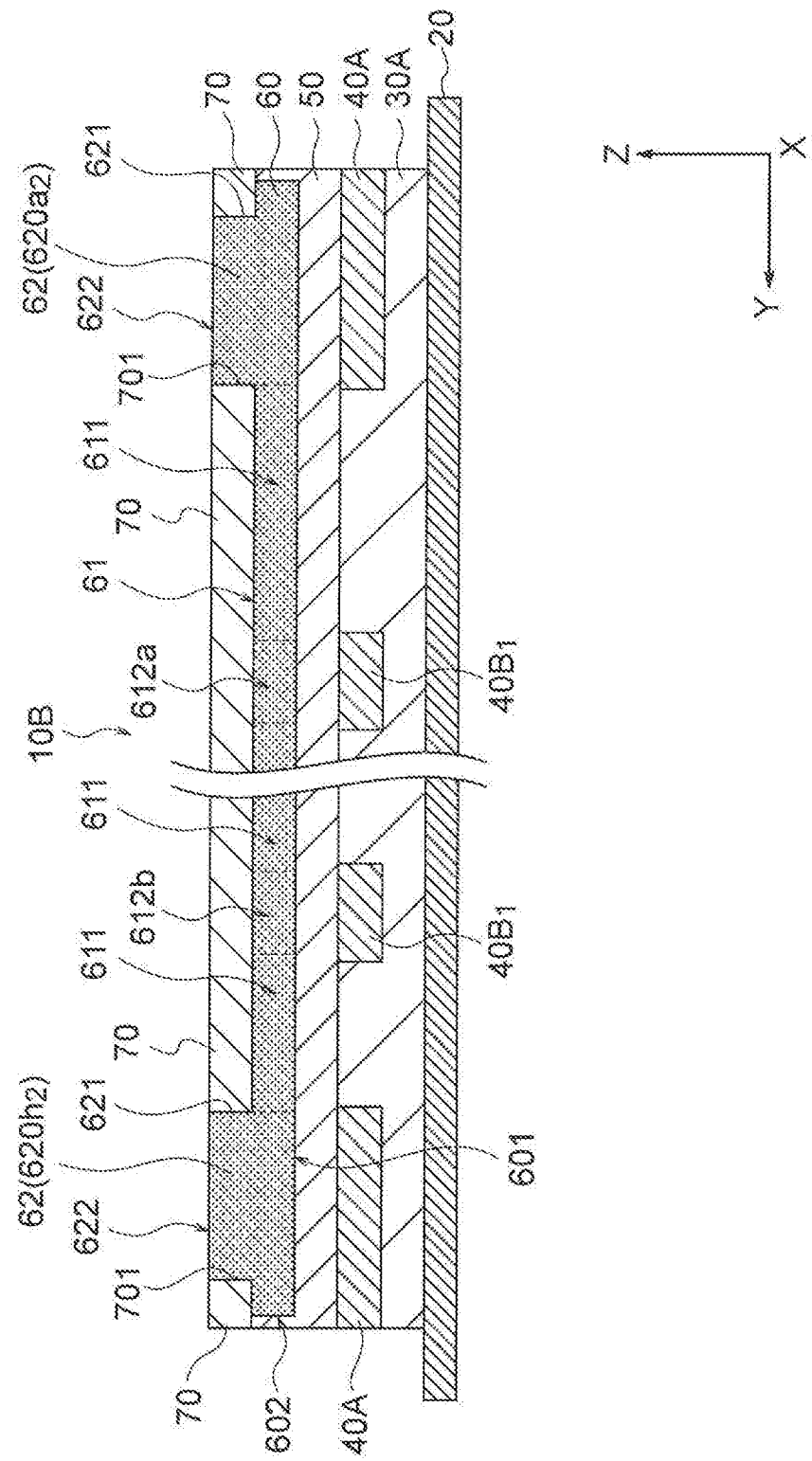
FIG. 9 is a cross-sectional view taken along IX-IX line of FIG. 8.
Figure 10:
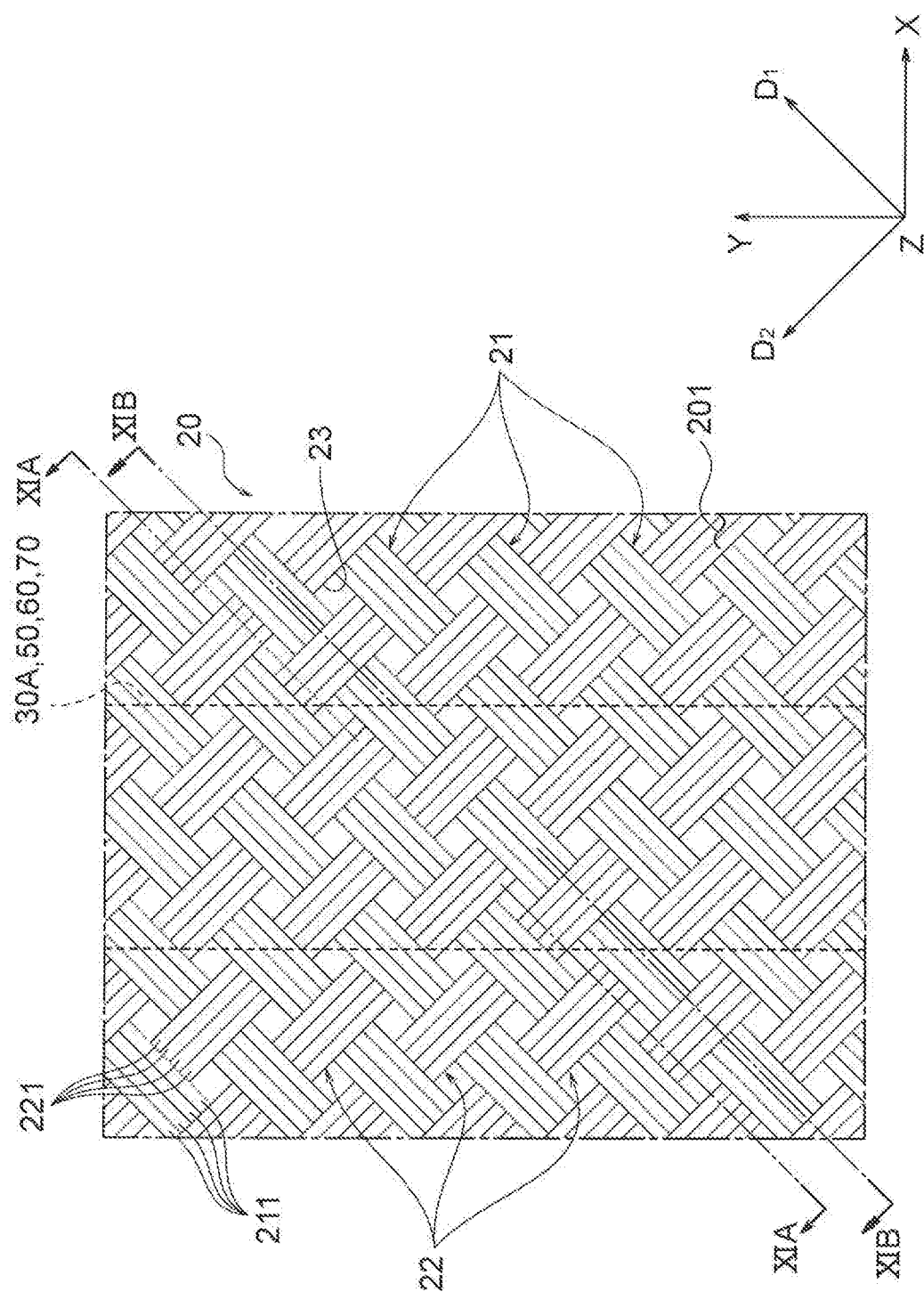
FIG. 10 is an enlarged view of a X portion of FIG. 8.
Figure 11A:
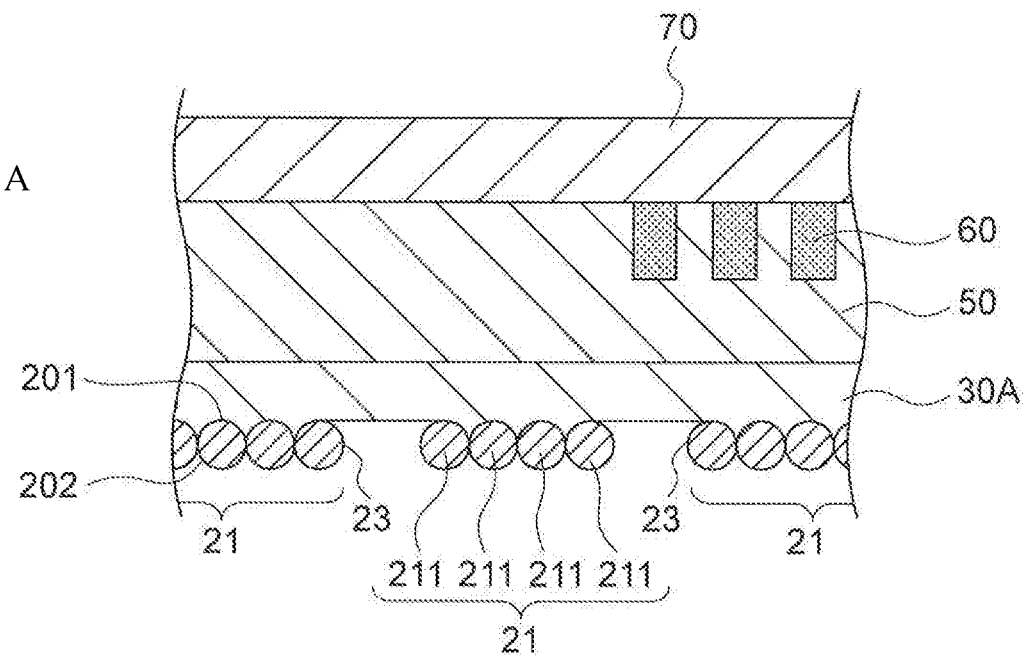
FIG. 11A is a cross-sectional view taken along XIA-XIA line of FIG. 10.
Figure 11B:
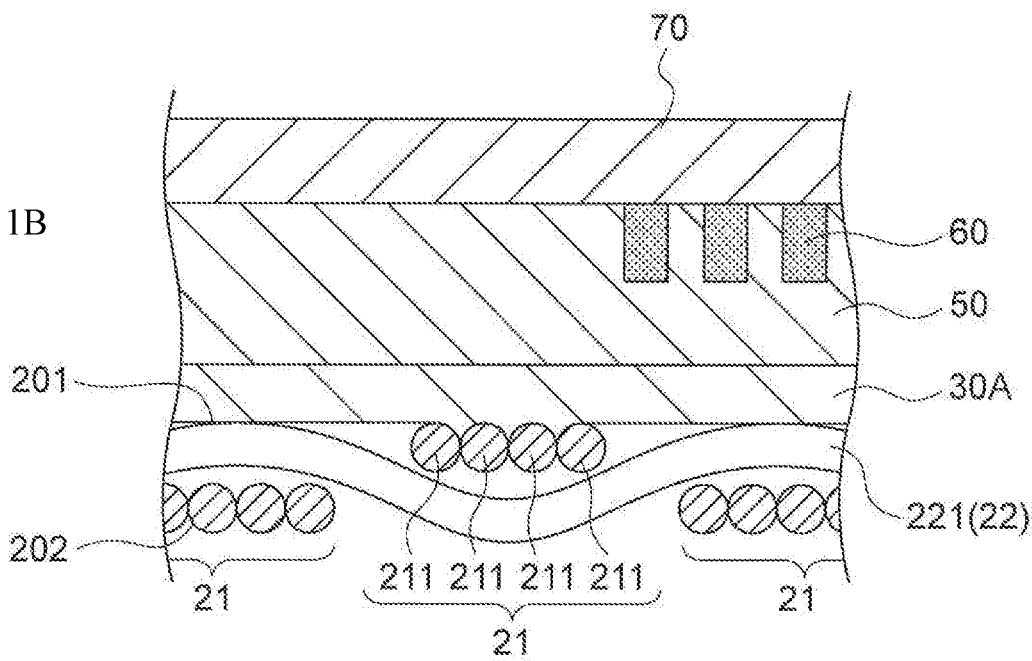
FIG. 11B is a cross-sectional view taken along XIB-XIB line of FIG. 10.
Figure 12:
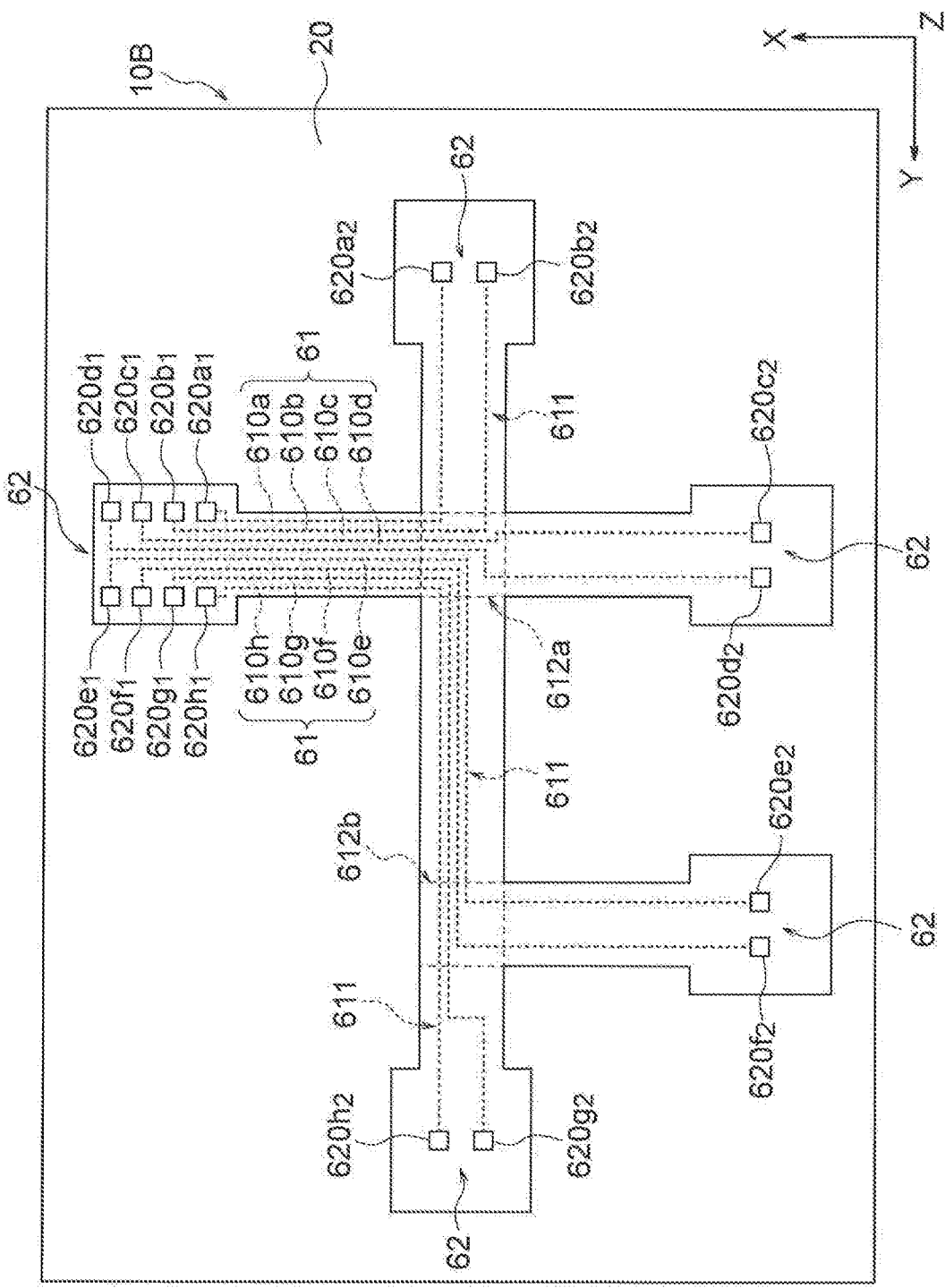
FIG. 12 is a plan view for explaining the conductor portion of the stretchable wiring board according to the second embodiment of the present invention.

FIG. 8 is a plan view of an stretchable wiring board in the second embodiment of the present invention, FIG. 9 is a sectional view taken along IX-IX line of FIG. 8, FIG. 10 is an enlarged view of the X portion of FIG. 8, FIG. 11A is a cross-sectional view taken along XIA-XIA line of FIG. 10, FIG. 11B is a cross-sectional view taken along XIB-XIB line of FIG. 10, FIG. 12 is a plan view for explaining the conductor portion of the stretchable wiring board. In FIG. 10, the hot-melt layer 30A, the primer layer 50, the conductor portion 60, and the overcoat layer 70, for convenience, is shown by a dashed line. Further, in FIG. 8, although the electronic component 200 mounted on the connection portion 62 is illustrated, in FIGS. 9 and 12, for convenience, the electronic component 200 mounted on the connection portion 62 is not illustrated.

The stretchable wiring board 10B shown in FIGS. 8 and 9 is used, for example, in the wearable device such as the biometric sensor or a medical device such as the biometric information monitor in a portion where the stretchability is required, same to the first embodiment. Since the wearable device and the medical device are provided on clothes and the braces, it is necessary for the stretchable wiring board 10B to sufficiently follow the bending of the human body. On such stretchable wiring board 10B, as shown in FIG. 8, for example, the electronic component 200 is provided. As the electronic component, a pressure sensitive sensor or silver/silver chloride electrode are formed, or a mounted component such as an integrated circuits (IC), a condenser, or a light emitting diode (LED) are mounted. The use of the stretchable wiring board 10B is not particularly limited as long as it requires an stretchable property.

As shown in FIGS. 8 and 9, the stretchable wiring board 10B of the present embodiment includes a fabric 20, a hot-melt layer 30A, a first reinforcing member 40A, a second reinforcing member 40B, a primer layer 50, a conductor portion 60, and an overcoat layer 70. The "stretchable wiring board 10B" in the present embodiment corresponds to an example of the "stretchable wiring board," the "fabric 20" in the present embodiment corresponds to an example of the "fabric," the "hot-melt layer 30A" in the present embodiment corresponds to an example of the "first stretchable base material," the "first reinforcing member 40A" in the present embodiment corresponds to an example of the "first reinforcing member," the "second reinforcing member 40B" in the present embodiment corresponds to an example of the "second reinforcing member," the "primer layer 50" in the present embodiment corresponds to an example of the "primer layer," the "conductor portion 60" in the present embodiment corresponds to an example of the "conductor portion," and the "overcoat layer 70" in the present embodiment corresponds to an example of the "overcoat layer."

The fabric 20 is an object to which the hot-melt layer 30A is to be affixed, and is a fabric portion of a garment or a brace provided with a wearable device or the like. Similarly to the first embodiment, this fabric 20 is composed of a woven fabric composed of a plurality of fibers, and more specifically, is constituted by a first fiber bundle 21 and a second fiber bundle 22 which intersect each other as shown in an enlarged view of FIG. 10.

In plan view, a rectangular gap 23 is formed between the first fiber bundle 21 and the second fiber bundle 22 crossing each other. In plan view, the gap 23 is defined by first fiber bundles 21 and 21 adjacent to each other and second fiber bundles 22 and 22 adjacent to each other.

The gap 23 opens to one main surface 201 of the fabric 20 and opens to the other main surface 202 (see FIGS. 11A and 11B) of the fabric 20, and communicates between the one main surface 201 and the other main surface 202 of the fabric 20. The gap 23 may not extend straight along thickness of the fabric 20, but may open at both major surfaces 201, 202 and communicate with both major surfaces 201, 202. The gap 23 is deformed in accordance with the modification of the stretchable wiring board 10B, whereby the fabric 20 as a whole exhibits stretchability.

The hot-melt layer 30A is affixed to the main surface 201 of the fabric 20 as shown in FIGS. 11A and 11B, and is formed on the fabric 20 as in the first embodiment. This hot-melt layer 30A has stretchability, and as a constituent material thereof, the same material as in the first embodiment can be used.

Returning to FIGS. 8 and 9, the first reinforcing member 40A is disposed so as to overlap the connection portion 62 when viewed from thickness direction of the conductor portion 60. This first reinforcing member 40A is buried in the hot-melt layer 30A, and is interposed between the hot-melt layer 30A and the primer layer 50. Since an external device is connected in the connection portion 62, the connection portion 62 is easily stressed. It is possible to prevent damage to the connection portion 62 by reinforcement by the first reinforcing member 40A. In addition, since the first reinforcing member 40A is buried in the hot-melt layer 30A, even if the first reinforcing member 40A is disposed, a difference in level does not occur in the stretchable wiring board 10B. Therefore, the smoothness of both main surfaces of the stretchable wiring board 10B can be improved. In addition, the first reinforcing member 40A is interposed between the hot-melt layer 30A and the conductor portion 60, and the first reinforcing member 40A is disposed at a position close to the conductor portion 60. Therefore, the connection portion 62 can be reliably reinforced. The "connection portion 62" in the present embodiment corresponds to an example of the "connection portion."

Although not particularly limited, distance LA between the first reinforcing member 40A and the second reinforcing member 40B adjacent to the first reinforcing member 40A (see FIG. 8) may satisfy the following equation (1).

$$50 \text{ mm} \leq L_A \leq 200 \text{ mm} \tag{1}$$

Although there is no particular limitation on such a first reinforcing member 40A, as in the first embodiment, an adhesive tape or the like can be used.

The second reinforcing member 40B (the second reinforcing member $40B_1$ and the second reinforcing member $40B_2$) is disposed so as to overlap a part of the wiring portion 61 when viewed from thickness direction of the conductor portion 60 (the Z direction in the drawings. and also thickness direction of the stretchable wiring board 10B). Further, the second reinforcing member 40B is buried in the hot-melt layer 30A, and as a result, the second reinforcing member 40B is interposed between the hot-melt layer 30A and the primer layer 50. Since the second reinforcing member 40B is buried in the hot-melt layer 30A, even if the second reinforcing member 40B is disposed, the difference in level does not occur in the stretchable wiring board 10B. Therefore, it is possible to improve the smoothness of both main surfaces of the stretchable wiring board 10B. The "wiring portion 61" in the present embodiment corresponds to an example of the "wiring portion."

The plurality of second reinforcing members 40B are disposed so as to be spaced apart from each other along the extending direction of the wiring portion 61. More specifically, the second reinforcing member $40B_1$ is disposed so as to overlap the first and second branch portions 612a, 612b in which the wiring portion 61 branches into a plurality (from which a branch(s) of the wiring portion 61 extends) when viewed from thickness direction of the conductor portion 60, while the second reinforcing member $40B_2$ is disposed so as to overlap a portion of the wiring body portion 611 of the wiring portion 61 when viewed from thickness direction of the conductor portion 60 (the second reinforcing member $40B_2$ disposed between the second reinforcing member $40B_1$ is omitted in the cross-sectional view of FIG. 9). Although stresses tend to concentrate on the first and second branch portions 612a and 612b, the durability of the first and second branch portions 612a and 612b can be improved by providing the second reinforcing member $40B_1$ here. In addition, since the handling can be performed with the second reinforcing member $40B_1$ disposed in the first and second branch portions 612a and 612b as a fulcrum, the handling performance of the stretchable wiring board 10B is improved. The "first branch portion 612a" and the "second branch portion 612b" in this embodiment correspond to an example of the "branch portion."

Consequently, the second reinforcing member $40B_1$, $40B_2$ are intermittently disposed along the wiring portion 61. In other words, the second reinforcing members $40B_1$, $40B_2$ are disposed along the wire portion 61 with a gap therebetween. As described above, since the second reinforcing member $40B_1$ is disposed so as to overlap the first and second branch portions 612a and 612b, it is possible to restrain the wiring portion 61 from breaking in the first and second branch portions 612a, 612b.

Further, although not particularly limited, the distance $L_B$ between the second reinforcing member $40B_1$, $40B_2$ adjacent to each other (see FIG. 8) satisfies the following equation (2).

$$50 \text{ mm} \leq L_B \leq 200 \text{ mm} \quad (2)$$

By setting the distances $L_B$ between the second reinforcing members $40B_1$ and $40B_2$ adjacent to each other within the above ranges, the stiffness can be sufficiently increased while the stretchability of the stretchable wiring board 10B is secured. Further, since the stretchable wiring board 10B can be easily handled with the second reinforcing member 40B as a fulcrum, it is possible to further improve the handling of the stretchable wiring board 10B.

The intervals between the adjacent second reinforcing members 40B may be equal or irregular. The interval can be appropriately selected according to the design of the stretchable wiring board 10B. Further, in the present embodiment, the case where the plurality of first reinforcing members 40A are disposed is illustrated, but the number of second reinforcing members 40B may be one, for example, in the case where the total length of the stretchable wiring board 10B is relatively short.

The second reinforcing member 40B may be composed of the same material as the first reinforcing member 40A, or may be composed of a different material. Although not particularly limited, for example, in the case where the necessary rigidity is different between the wiring portion 61 and the connection portion 62, the first reinforcing member 40A and the second reinforcing member 40B may be composed of materials having different rigidity. Further, the second reinforcing member 40B is made of a harder material than that of the hot-melt layer 30A, the Young's modulus $E_{RB}$ of the second reinforcing member 40B is larger than the Young's modulus $E_h$ of the hot-melt layer 30A ($E_{RB}>E_h$).

The primer layer 50 is provided on the hot-melt layer 30A and the first and second reinforcing members 40A and 40B, and is interposed between the hot-melt layer 30A and the conductor portion 60. The primer layer 50 covers the lower surface 601 and the side surface 602 of the conductor portion 60, and the planar shape of the primer layer 50 is substantially the same as the planar shape of the conductor portion 60. Further, the primer layer 50 has stretchability similarly to the fabric 20 and the like. The material constituting the primer layer 50 may be the same as that of the first embodiment.

As shown in FIG. 9, the conductor portion 60 is provided on the primer layer 50, and includes a wiring portion 61 covered with the overcoat layer 70, and a connection portion 62 exposed to the outside from the overcoat layer 70. As shown in FIG. 8, the conductor portion 60 has a strip-like planar shape made up of a bundle of conductor lines (described below). The hot-melt layer 30A, the primer layer 50, and the overcoat layer 70 also have a strip-like planar shape along the conductor portion 60.

The wiring portion 61 is integrally formed with the connection portion 62, thereby electrically connecting the plurality of connection portions 62 to each other. As shown in FIG. 12, the wiring portion 61 is composed of the bundle of conductor lines 610a to 610h extending in parallel with each other. The wiring portion 61 includes wiring body portions 611, and first and second branch portions 612a and 612b that connect the plurality of wiring body portions 611.

The connection portion 62, as shown in FIG. 9, has a protruding portion 621 protruding in a direction away from the hot-melt layer 30A, the exposed surface 622 of the protrusion 621 is exposed from the overcoat layer 70. The connection portion 62 can be used as a connection terminal with the electronic component 200 (refer to FIG. 8), in the exposed surface 622, to ensure conduction between the electronic component 200.

As shown in FIG. 12, the connection portion 62 includes a plurality of connecting terminals $620a_1$ to $620h_1$ and $620a_2$ to $620h_2$, to which a plurality of conductive lines 610a to 610h are connected, respectively. Though not particularly shown in FIG. 12, electronic components 200 (refer to FIG. 8) such as various sensors, connectors, ICs, LEDs, and condensers are provided on the connecting terminals $620a_1$ to $620h_1$ and $620a_2$ to $620h_2$.

In the present embodiment, the "connecting terminal" is exemplified as the "connection portion 62", but the present invention is not limited thereto. As the connection portion 62, for example, a connector terminal or pressure sensitive sensor for connecting to the connector of the electronic component 200 may be directly formed.

In the conductor portion 60 as described above, the conductor lines 610a to 610h and the connecting terminals $620a_1$ to $620h_1$ and $620a_2$ to $620h_2$ are connected to each other as follows. First, the conductive lines $610a$ to $610h$ extend in the −X direction from the connecting terminals $620a_1$ to $620h_1$, respectively, and then branch in three directions in the first branch portions $612a$.

Of these, the conductive lines $610a$ and $610b$ are bent in the −Y direction in the first branch portions $612a$, then extend in the −Y direction, and are finally connected to the connecting terminals $620a_2$ and $620b_2$, respectively. The conductive lines $610c$ and $610d$ extend in the −X direction without changing the extension direction, and are then connected to the connecting terminals $620c_2$ and $620d_2$, respectively.

On the other hand, the conductor lines $610e$ to $610h$ bend in the +Y direction in the first branch portion $612a$, then extend to the second branch portion $612b$, and branch in two directions in the second branch portion $612b$. Of these, the conductor lines $610e$ and $610f$ are bent in the −X direction in the second branch portions $612b$, then extend in the −X direction, and are finally connected to the connecting terminals $620e_2$ and $620f_2$, respectively. The conductor lines $610g$ and $610h$ extend in the +Y direction without changing the extension direction, and are thereafter connected to the connecting terminals $620g_2$ and $620h_2$, respectively. As a result, the connecting terminals $620a_1$ to $610h_1$ and $620a_2$ to $610h_2$ are connected to both ends of the respective conductive lines $610a$ to $610h$.

In the present embodiment, the wiring portion 61 has a branched planar shape, but is not limited thereto. The planar shape of the wiring portion 61 may not be branched. The wiring body portion 611 may be curved. Further, the wiring portion 61 may be constituted by a single conductor wire.

As in the first embodiment, the conductor portion 60 as described above is formed by dispersing conductive particles in a binder, and has elasticity.

The overcoat layer 70 is provided on the conductor portion 60 and the primer layer 50, and protects the conductor portion 60 by covering at least a part of the conductor portion 60. Specifically, the upper surface of the wiring portion 61 and the side surface of the protrusion 621 is covered with the overcoat layer 70. A hole 701 is formed in the overcoat layer 70 and penetrates from one main surface to the other main surface of the overcoat layer 70. A protruding portion 621 is formed inside the hole 701.

As in the case of the fabric 20, the overcoat layer 70 may have stretchability. As a material constituting the overcoat layer 70, the same material as in the first embodiment can be used.

The stretchable wiring board 10B of the present embodiment as described above has the following effects.

The stretchable wiring board is easy to bend because of its low rigidity. When the total length of the stretchable wiring board is longer, the wiring portion is lengthened, the bending or twisting is likely to occur in the region where the wiring portion is formed. In contrast, the stretchable wiring board 10B of the present embodiment, in plan view, for arranging the first reinforcing member 40A harder than the hot-melt layer 30A at a position overlapping the wiring portion 61, rigidity of the portion in which the first reinforcing member 40A is disposed is improved.

As a result, in the region where the wiring portion 61 of the stretchable wiring board 10B is formed, in order to stretchable wiring board 10B is less likely to bend, the portion where the first reinforcing member 40A is disposed as a fulcrum, since the handling of the stretchable wiring board 10B can be performed, the handling performance of the stretchable wiring board 10B is improved.

Figure 13:
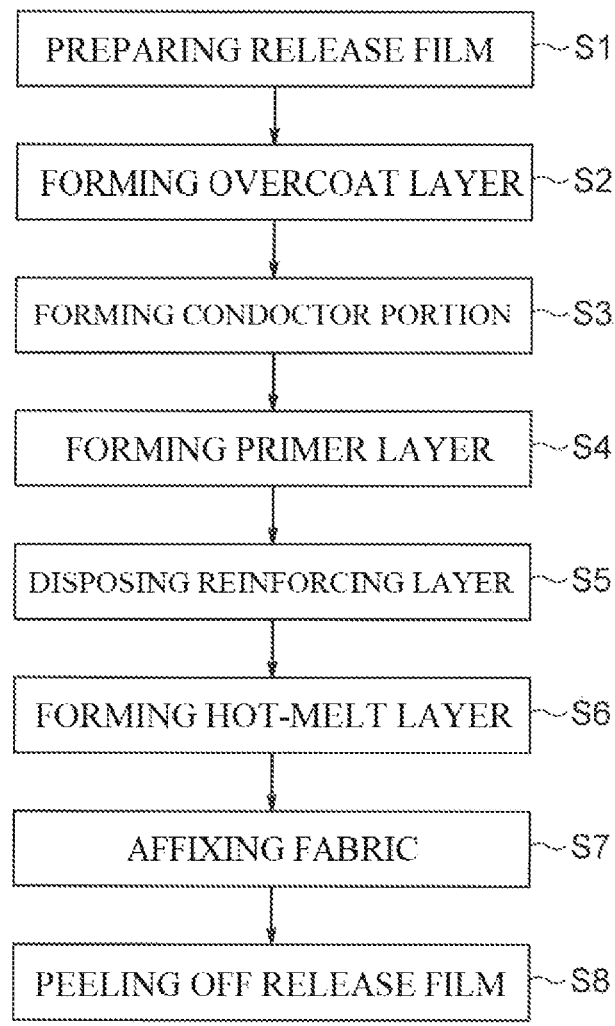
FIG. 13 is a flow sheet showing a method of manufacturing an stretchable wiring board according to the second embodiment of the present invention.

Next, a method of manufacturing the stretchable wiring board 10B of the present embodiment will be described with reference to FIGS. 13 and 14A to 14H. FIG. 13 is a flow sheet for explaining the method of manufacturing the stretchable wiring board 10B according to the present embodiment. FIGS. 14A to 14H are diagrams showing respective steps (steps S1 to S8) of FIG. 13.

Figure 14A:
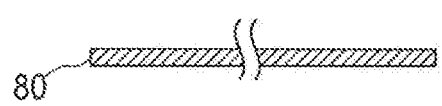
FIGS. 14A to 14H are cross-sectional views for explaining each of steps S1 to S8 of FIG. 13.

First, in the step S1 of FIG. 13, as shown in FIG. 14A, a release film 80 is prepared. This release film 80 is a resin film subjected to a release process, and is not particularly limited, and for example, a release treatment PET film can be used as the release film 80.

Figure 14B:
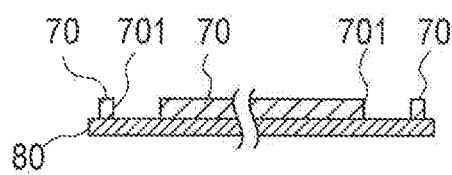

Next, in the step S2 of FIG. 13, as shown in FIG. 14B, the overcoat layer 70 having a predetermined pattern is formed on one main surface of the release film 80. Here, the holes 701 in which the overcoat layer 70 is not formed on the release film 80 are also formed at the same time. The overcoat layer 70 is formed by coating a material constituting the overcoat layer 70 described above on the release film 80 and curing the material. As the coating method, various coating methods such as a screen printing method, a spray coating method, a bar coating method, a dip method, and an inkjet method can be employed. As a curing method, irradiation with energy rays such as ultraviolet rays and infrared laser rays, heating, heating and cooling, drying, or the like can be employed.

Figure 14C:
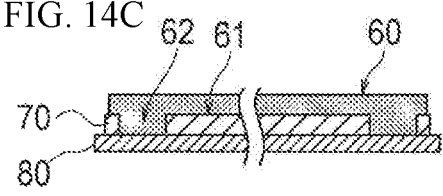

Next, in the step S3 of FIG. 13, as shown in FIG. 14C, the conductor portion 60 is formed. At this time, the connection portion 62 is formed in the inside of the hole 701, and a wiring portion 61 is formed on the overcoat layer 70. The conductor portion 60 is formed by applying a conductive paste to the inside of the hole 701 and on the overcoat layer 70, and curing the conductive paste. Specific examples of the conductive paste for forming the conductor portion 60 may be exemplified by conductive particles, a binder, water or a solvent, and a conductive paste constituting by mixing various additives. Examples of the solvent contained in the conductive paste include butyl cellosolve acetate, carbitol acetate, butyl carbitol acetate, dipropylene glycol monobutyl Ether, diethylene glycol monoethyl Ether, cyclohexanone, isophorone, and terpineol. As for the coating method and the curing method, the same method as in the case of forming the overcoat layer 70 can be used.

Figure 14D:
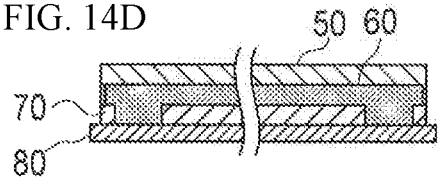

Next, in the step S4 of FIG. 13, as shown in FIG. 14D, the primer layer 50 is formed on the conductor portion 60. The primer layer 50 is formed by applying the above-described resin material to the conductor portion 60 and curing the resin material. As for the coating method and the curing method, the same method as in the case of forming the overcoat layer 70 can be used.

Figure 14E:
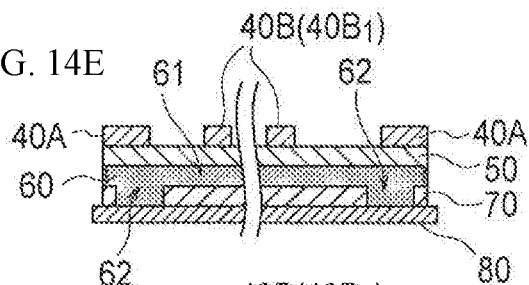

Next, in the step S5 of FIG. 13, as shown in FIG. 14E, the first reinforcing member 40A and the second reinforcing member 40B is disposed on the primer layer 50. The first reinforcing member 40A is disposed so as to overlap the connection portion 62 when viewed from the lamination direction of each layer. On the other hand, the second reinforcing member 40B is disposed so as to overlap the wiring portion 61 when viewed from the laminating direction of each layer. Although not particularly limited, specifically, the above-described adhesive tape may be prepared, and the first and second reinforcing members 40A and 40B are formed by affixing the adhesive layer of the adhesive tape to the primer layer 50.

Figure 14F:
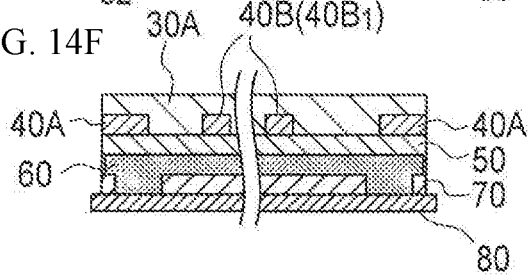

Next, in the step S6 of FIG. 13, as shown in FIG. 14F, a hot-melt layer 30A is formed on the first and second reinforcing members 40A and 40B and the primer layer 50. The hot-melt layer 30A can be formed by placing the above-described thermoplastic hot-melt adhesive on the first and second reinforcing members 40A, 40B and the primer layer 50. At this time, the hot-melt adhesive may be heated and molded into an arbitrary shape. Further, as this adhesive, a sheet-like hot-melt adhesive may be prepared, and the sheet-like hot-melt adhesive may be affixed to the first and second reinforcing members 40A and 40B and the primer layer 50 by using a thermal laminator or the like.

Figure 14G:
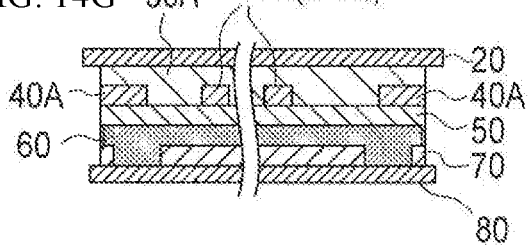

Next, in the step S7 of FIG. 13, as shown in FIG. 14G, the hot-melt layer 30A is affixed to the fabric 20. Although not particularly limited, specifically, the hot-melt layer 30A in a state that is softened by heating is affixed to the fabric 20. In particular, according to the stretchable wiring board 10B in the present embodiment, since the region where the wiring portion 61 is formed is imparted with rigidity by the second reinforcing member 40B, the handling performance of the stretchable wiring board 10B in the affixing operation is improved.

Figure 14H:
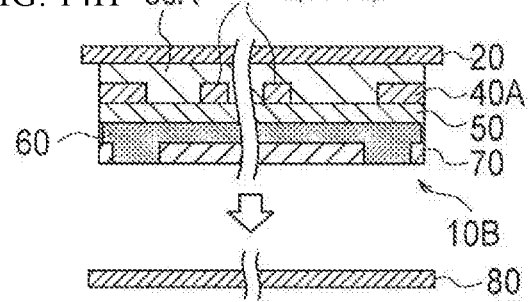

Next, in the step S8 of FIG. 13, as shown in FIG. 14H, the release film 80 is peeled off from the stretchable wiring board 10B. Note that the timing at which the release film 80 is peeled off is not limited only after the fabric 20 is affixed. For example, the release film 80 may be peeled off after the formation of the hot-melt layer 30A (after the step S6 in FIG. 13) and before the attachment of the fabric 20 (before the step S7 in FIG. 13).

Third Embodiment

Figure 15:
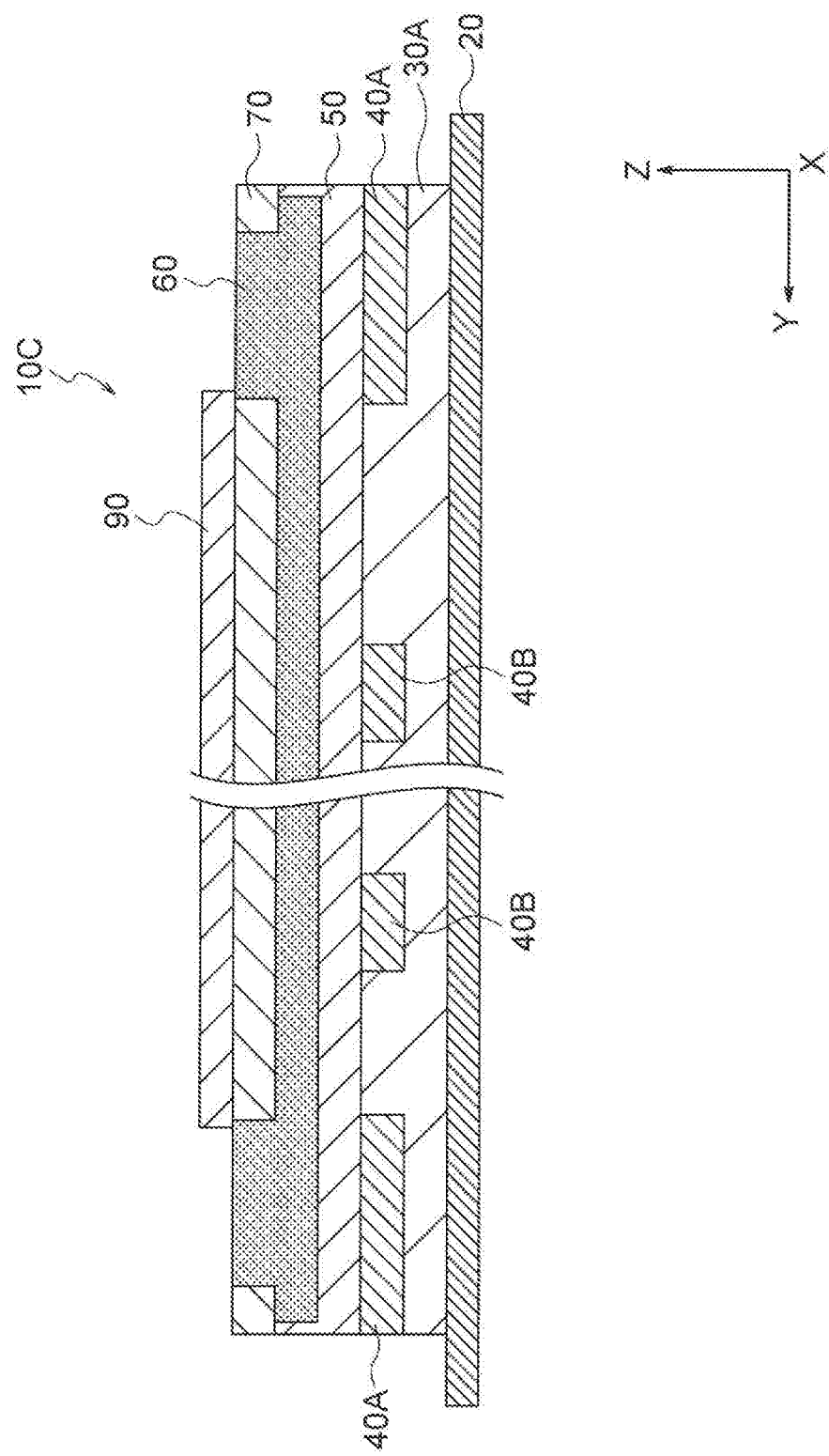
FIG. 15 is a cross-sectional view of a stretchable wiring board according to the third embodiment of the present invention.

FIG. 15 is a cross-sectional view of an stretchable wiring board 10C according to the third embodiment. The present embodiment is different from the second embodiment in that the stretchable wiring board 10C includes the seam tape 90, but the other configuration is the same as the second embodiment. Hereinafter, only the seam tape 90, which is a difference from the second embodiment in the third embodiment, will be described, and the same reference numerals are given to the same components as those in the second embodiment, and the description thereof will be omitted. The "seam tape 90" in this embodiment corresponds to an example of the "second stretchable substrate."

The difference between the stretchable board 10C and the stretchable board 10B in the second embodiment is that the seam tape 90 is affixed on the overcoat layer 70. This seam tape 90 is affixed to a position corresponding to the wiring portion 61.

The seam tape 90 has stretchability, and there is no particular limitation on the seam tape 90, but a seam tape provided with a hot-melt on a main surface of a film composed of a urethane-based elastomer can be used. Further, seam tape 90 is softer than the second reinforcing member 40B (in other words, the second reinforcing member 40B is harder than the seam tape 90), the Young's modulus $E_s$ of the seam tape 90 is smaller than the Young's modulus $E_{RB}$ of the second reinforcing member ($E_s < E_{RB}$). Also, the rupture elongation $B_s$ of seam tape 90 is greater than the rupture elongation $B_h$ of hot-melt layer 30A ($B_s > B_h$).

Also in the stretchable wiring board 10C in the third embodiment, the handling performance of the stretchable wiring board 10C can be improved in the same manner as in the second embodiment described above. In particular, since the rigidity of the portion where the wiring portion 61 is formed of the stretchable wiring board 10C is further improved by the seam tape 90, the handling property is further improved.

Note that the "second stretchable substrate" is not limited to only the seam tape 90. As the "second stretchable substrate", various resin materials can be used, and in particular, the resin material may have a waterproof property. In the third embodiment, "seam tape" is exemplified as a resin material having waterproofness.

The method of manufacturing the stretchable wiring pattern board 10C of the present embodiment is basically the same as the method of manufacturing the stretchable wiring board 10B of the second embodiment, but differs from the second embodiment in that it has difference of attaching the seam tape 90 after the step S8 of FIG. 13. In this step, a hot-melt included in the seam tape 90 may be affixed onto the overcoat layer 70 by a thermal laminator or the like. Thus, the stretchable wiring board 10C is manufactured.

Fourth Embodiment

Figure 16:
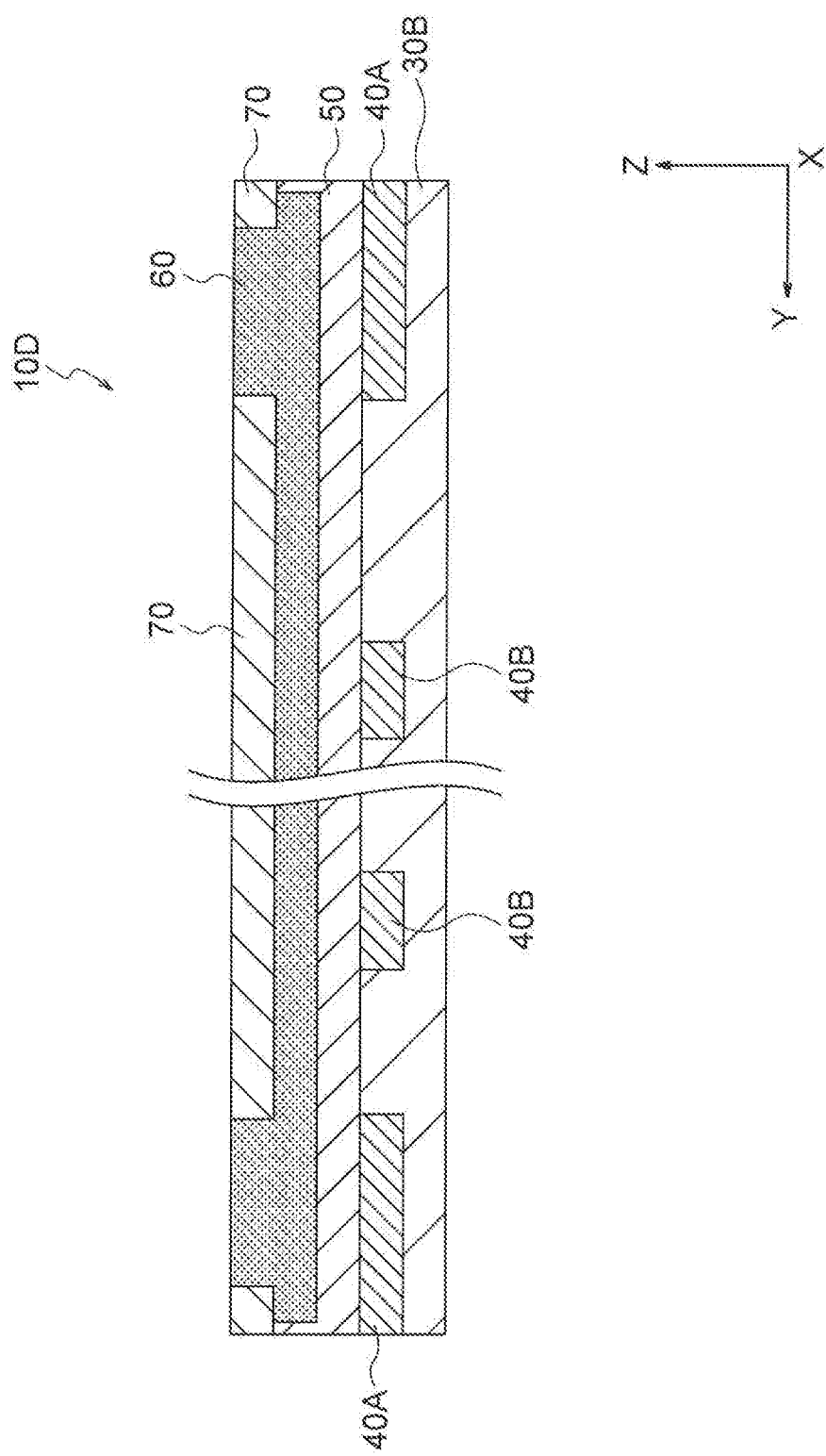
FIG. 16 is a cross-sectional view of a stretchable wiring board according to the fourth embodiment of the present invention.

FIG. 16 is a cross-sectional view of an stretchable wiring board 10D according to the fourth embodiment of the present invention. In this embodiment, the first stretchable substrate of the stretchable wiring board 10D is an elastomer layer 30B rather than a hot-melt layer 30A, and is different from the second embodiment in that the fabric 20 is not attached, but the other configurations are the same as those of the second embodiment. Hereinafter, only the difference from the second embodiment in the fourth embodiment will be described, and the same reference numerals are given to the same components as those in the second embodiment, and description thereof will be omitted. The "elastomer layer 30B" in this embodiment corresponds to an example of the "first stretchable substrate."

The elastomer layer 30B is formed at the lowermost portion of the stretchable wiring board 10D, and has substantially the same planar shape as the primer layer 50, the conductor portion 60, and the overcoat layer 70. In this embodiment, the first and second reinforcing members 40A and 40B are buried in the elastomer layer 30B, and the primer layer 50 is formed on the elastomer layer 30B. The fabric 20 of the first embodiment is not affixed to the elastomer layer 30B.

As a material constituting the elastomer layer 30B, for example, natural rubber, styrene butadiene rubber, butadiene rubber, chloroprene rubber, butyl rubber, nitrile rubber, ethylene propylene rubber, acrylic rubber, urethane rubber, silicone rubber, or fluorine rubber can be used. Note that other elastomeric materials may be used.

The Young's modulus EE of the elastomer layer 30B may be 0.1 MPa to 35 MPa. The maximum elongation LEE of the elastomer layer 30B may be 5 to 50%. The rupture elongation BE of the elastomer layers 30B may be 50% or more. The thickness $T_E$ of the elastomeric layer 30B may be 20 μm to 300 μm.

Also in the stretchable wiring board 10D in the fourth embodiment, the handling performance of the stretchable wiring board 10D can be improved in the same manner as in the second embodiment described above.

The stretchable wiring board 10D of the fourth embodiment can be manufactured by printing the primer layer on an elastomer substrate, printing the conductor portion, and printing the overcoat layer.

Fifth Embodiment

Figure 17:
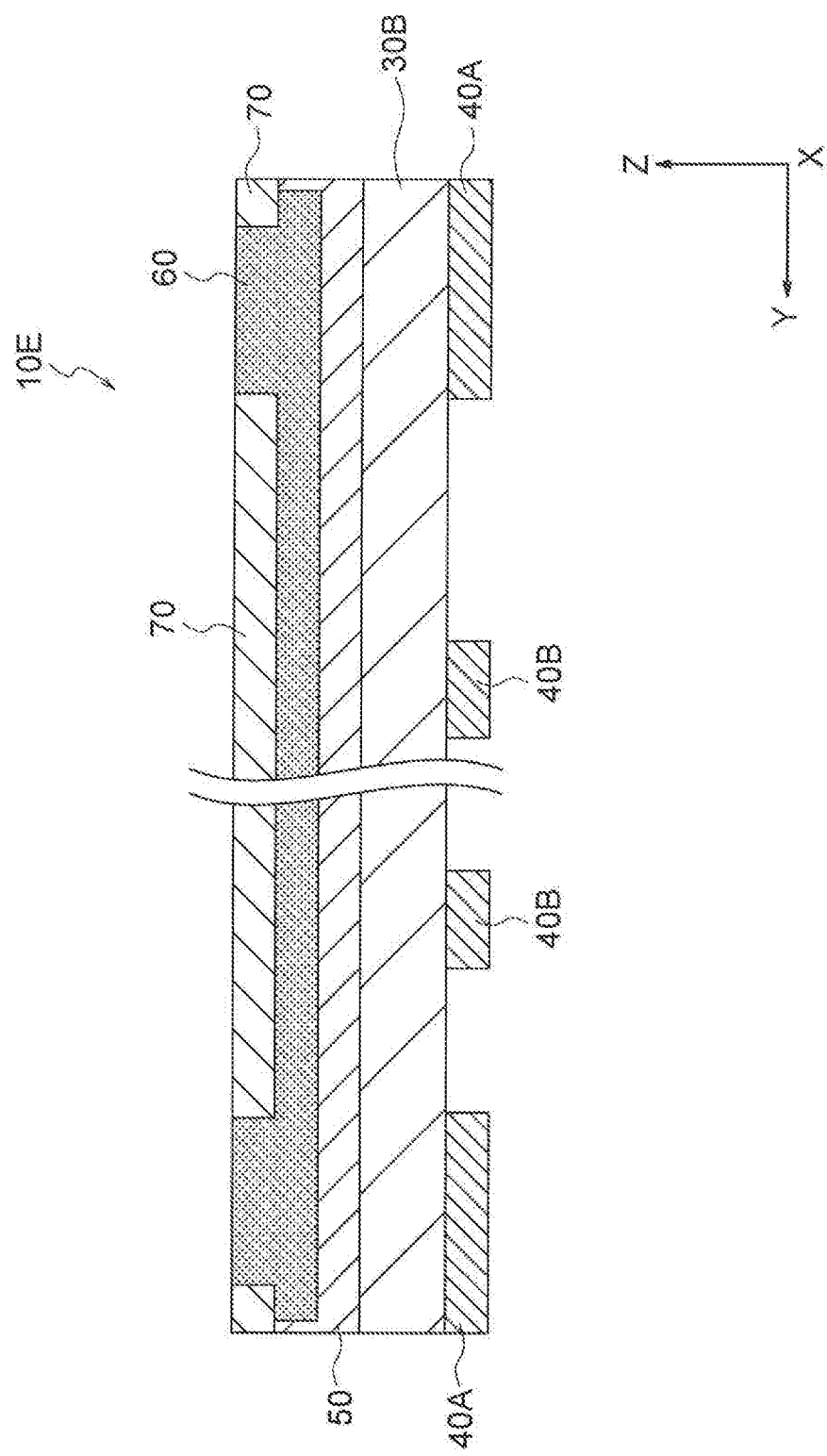
FIG. 17 is a cross-sectional view of a stretchable wiring board according to the fifth embodiment of the present invention.

FIG. 17 is a cross-sectional view of an stretchable wiring board 10E according to the fifth embodiment of the present invention. The present embodiment differs from the fourth embodiment in that the first and second reinforcing members 40A and 40B are formed on the lowermost surface of the stretchable wiring board 10E, but the other configurations are the same as those of the fourth embodiment. Hereinafter, only the difference from the fourth embodiment in the fifth embodiment will be described, and the same reference numerals are given to the same components as those in the third embodiment, and description thereof will be omitted.

In the stretchable wiring board 10E according to the fifth embodiment, the first and second reinforcing members 40A and 40B are affixed to the lower surface of the elastomer layer 30B. That is, the first and second reinforcing members 40A and 40B are not buried in the elastomer layer 30B, the first and second reinforcing members 40A and 40B are spaced apart from the primer layer 50, the elastomer layer 30B is interposed between the primer layer 50 and the first and second reinforcing members 40A and 40B.

Also in the stretchable wiring board 10E in the fifth embodiment, the handling performance of the stretchable wiring board 10E can be improved in the same manner as in the second embodiment described above.

The stretchable wiring board 10E in this fifth embodiment can basically be manufactured by the same manufacturing method as the manufacturing method of the stretchable wiring board 10D in the fourth embodiment, except that the first and second reinforcing members 40A and 40B are affixed to the elastomer layer 30B after the elastomer layer 30B is formed.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, the manufacturing method of the stretchable wiring board 10A is not limited to only the first embodiment described above, and the order of performing the second to seventh steps is not limited to only the order in the embodiments described above. For example, a third step may be performed prior to the second step. That is, before the overcoat layer 70 is formed, the connection portion 62 may be formed on the release film 80, then the overcoat layer 70 may be formed, and then the wiring portion 61 may be formed.

The first and second reinforcing members 40A and 40B may be affixed to the overcoat layer 70. In addition, for example, when the waterproof property can be sufficiently secured, the primer layer 50 may not be provided. That is, in the above embodiments, the conductor portion 60 is indirectly provided on the hot-melt layer 30A or the elastomer layer 30B via the primer layer 50, but the conductor portion 60 may be directly provided on the first stretchable substrate, and "provided on the first stretchable substrate" in the present embodiment means "provided indirectly or directly on the first stretchable substrate".

The method of manufacturing the stretchable wiring board 10B is not limited to only the above-described embodiments, and the order of performing steps 2 to 8 is not limited to only the order in the above-described second embodiment (refer to FIG. 12). For example, before the overcoat layer 70 is formed, the connection portion 62 may be formed on the release film 80, then the overcoat layer 70 may be formed, and then the wiring portion 61 may be formed.

Further, before the overcoat layer 70 is formed, a part of the connection portion 62 may be formed on the release film 80, after which the overcoat layer 70 is formed, and then the remaining portion of the connection portion 62 and the wiring portion 61 may be formed simultaneously. For example, such a manufacturing method can be used when a part of the connection portion 62 includes conductive particles of a different type from the wiring portion 61, and the remaining part of the connection portion 62 includes conductive particles of the same type as the wiring portion 61. More specifically, such a manufacturing method can be used in the case where a part of the connection portion 62 contains carbon as the conductive particles and the remaining portion of the connection portion 62 and the wiring portion 61 contain silver as the conductive particles.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

10A, 10B, 10C, 10D, 10E STRETCHABLE WIRING BOARD
20 FABRIC
21 FIRST FIBER BUNDLE
22 SECOND FIBER BUNDLE
23 GAP
201 ONE MAIN SURFACE
202 OTHER MAIN SURFACE
30A HOT-MELT LAYER
30B ELASTOMER LAYER
40A FIRST REINFORCING MEMBER
40B, 40B$_1$, 40B$_2$ SECOND REINFORCING MEMBER
50 PRIMER LAYER
60 CONDUCTOR PORTION
61 WIRING PORTION
610$a$ to 610$h$ CONDUCTOR WIRE
611 WIRING BODY PORTION
612$a$ FIRST BRANCH PORTION
612$b$ SECOND BRANCH PORTION
62 CONNECTION PORTION
601 BOTTOM SURFACE
602 SIDE SURFACE
621 PROTRUDING PORTION
622 EXPOSED SURFACE
70 OVERCOAT LAYER
701 HOLE
702 SURFACE
80 RELEASE FILM
90 SEAM TAPE
200 ELECTRONIC COMPONENT

The invention claimed is:

1. A stretchable wiring board comprising:
a first stretchable substrate;
an overcoat layer;
a conductor layer interposed at least partly between the first stretchable substrate and the overcoat layer; and
a first reinforcing member interposed between the first stretchable substrate and the conductor portion, wherein
the conductor layer comprises:
a wiring portion covered with the overcoat layer; and
a connection portion that has a surface exposed from the overcoat layer,
the exposed surface of the connection portion is flush with a top surface of the overcoat layer, and the first reinforcing member is harder than the first stretchable substrate.

2. The stretchable wiring board according to claim 1, wherein
the first reinforcing member overlaps with at least a part of the connection portion when viewed from a thickness direction of the conductor layer.

3. The stretchable wiring board according to claim 2, wherein the first reinforcing member is buried in the first stretchable substrate.

4. The stretchable wiring board according to claim 1, further comprising a second reinforcing member that overlaps with at least a part of wiring portion when viewed from a thickness direction of the conductor layer.

5. The stretchable wiring board according to claim 4, wherein
the wiring portion comprises a branch portion from which a branch of the wiring portion extends, and
the second reinforcing member overlaps with the branch portion when viewed from the thickness direction of the conductor layer.

6. The stretchable wiring board according to claim 4, wherein the second reinforcing member is buried in the first stretchable substrate.

7. The stretchable wiring board according to claim 4, further comprising a second stretchable substrate that covers the overcoat layer, wherein the second reinforcing member is harder than the second stretchable substrate.

8. The stretchable wiring board according to claim 1, further comprising a primer layer interposed between the first stretchable substrate and the conductor layer.

9. The stretchable wiring board according to claim 1, wherein the first stretchable substrate is composed of hot melt or elastomer.

10. The stretchable wiring board according to claim 9, further comprising a fabric affixed to the hot melt.

11. A method for manufacturing the stretchable wiring board according to claim 1, comprising:
preparing a release film;
forming the overcoat layer on the release film;
forming the connection portion on the release film;
forming the wiring portion on the overcoat layer; and
forming the first stretchable substrate.

12. The method for manufacturing the stretchable wiring board according to claim 11, further comprising:
affixing a fabric to the first stretchable substrate composed of hot melt; and
peeling off the release film.

13. A stretchable wiring board comprising:
a first stretchable substrate;
an overcoat layer;
a conductor layer interposed at least partly between the first stretchable substrate and the overcoat layer; and
a second reinforcing member that overlaps with at least a part of wiring portion when viewed from a thickness direction of the conductor layer, wherein
the conductor layer comprises:
a wiring portion covered with the overcoat layer; and
a connection portion that has a surface exposed from the overcoat layer,
the exposed surface of the connection portion is flush with a top surface of the overcoat layer, and
the second reinforcing member is harder than the first stretchable substrate.

14. A stretchable wiring board comprising:
a first stretchable substrate;
an overcoat layer;
a conductor layer interposed at least partly between the first stretchable substrate and the overcoat layer; and
a second reinforcing member that overlaps with at least a part of wiring portion when viewed from a thickness direction of the conductor layer, wherein
the conductor layer comprises:
a wiring portion covered with the overcoat layer; and
a connection portion that has a surface exposed from the overcoat layer,
the exposed surface of the connection portion is flush with a top surface of the overcoat layer, and
the stretchable wiring board comprises a plurality of second reinforcing members intermittently disposed along the wiring portion.

15. The stretchable wiring board according to claim 14, wherein the stretchable wiring board satisfies the following equation (1), $$50 \text{ mm} \leq L \leq 200 \text{ mm} \quad (1)$$

where L is a distance between the first reinforcing members adjacent to each other.

* * * * *